US008927957B2

(12) United States Patent
Lung

(10) Patent No.: US 8,927,957 B2
(45) Date of Patent: Jan. 6, 2015

(54) SIDEWALL DIODE DRIVING DEVICE AND MEMORY USING SAME

(75) Inventor: Hsiang-Lan Lung, Ardsley, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/570,660

(22) Filed: Aug. 9, 2012

(65) Prior Publication Data
US 2014/0042382 A1 Feb. 13, 2014

(51) Int. Cl.
H01L 29/18 (2006.01)
H01L 45/00 (2006.01)

(52) U.S. Cl.
USPC .......... 257/5; 257/2; 257/4; 257/42; 257/656; 257/E29.087; 257/E45.002

(58) Field of Classification Search
USPC ......... 257/2, 4, 5, 42, 656, E29.087, E45.002
See application file for complete search history.

(56) References Cited

U.S. PATENT DOCUMENTS

| 5,166,758 | A | 11/1992 | Ovshinsky et al. |
| 5,841,150 | A | 11/1998 | Gonzalez et al. |
| 6,034,882 | A | 3/2000 | Johnson et al. |
| 6,188,615 | B1 | 2/2001 | Perner et al. |
| 6,473,332 | B1 | 10/2002 | Ignatiev et al. |
| 6,521,973 | B2 | 2/2003 | Sharples et al. |
| 6,906,361 | B2 | 6/2005 | Zhang |
| 6,906,940 | B1 | 6/2005 | Lue |
| 7,081,377 | B2 | 7/2006 | Cleeves |
| 7,116,593 | B2 | 10/2006 | Hanzawa et al. |
| 7,129,538 | B2 | 10/2006 | Lee et al. |
| 7,177,169 | B2 | 2/2007 | Scheuerlein |
| 7,274,594 | B2 | 9/2007 | Pascucci et al. |
| 7,315,474 | B2 | 1/2008 | Lue |
| 7,365,385 | B2 | 4/2008 | Abbott |
| 7,382,647 | B1 | 6/2008 | Gopalakrishnan |
| 7,420,242 | B2 | 9/2008 | Lung |

(Continued)

FOREIGN PATENT DOCUMENTS

| EP | 1936681 A1 | 6/2008 |
| EP | 2048709 A2 | 4/2009 |

OTHER PUBLICATIONS

U.S. Appl. No. 13/089,934, filed Apr. 19, 2011 entitled "Sidewall Thin Film Electrode with Self-Aligned Top Electrode and Programmable Resistance Memory,", 33pp.

(Continued)

Primary Examiner — Victor A Mandala
(74) Attorney, Agent, or Firm — Yiding Wu; Haynes Beffel & Wolfeld LLP

(57) ABSTRACT

A memory device includes a first conductor, a diode, a memory element, and a second conductor arranged in series. The diode includes a first semiconductor layer over and in electrical communication with the first conductor. A patterned insulating layer has a sidewall over the first semiconductor layer. The diode includes an intermediate semiconductor layer on a first portion of the sidewall, and in contact with the first semiconductor layer. The intermediate semiconductor layer has a lower carrier concentration than the first semiconductor layer, and can include an intrinsic semiconductor. A second semiconductor layer on a second portion of the sidewall, and in contact with the intermediate semiconductor layer, has a higher carrier concentration than the intermediate semiconductor layer. A memory element is electrically coupled to the second semiconductor layer. The second conductor is electrically coupled to the memory element.

22 Claims, 18 Drawing Sheets

(56) References Cited

U.S. PATENT DOCUMENTS

| | | |
|---|---|---|
| 7,427,531 B2 | 9/2008 | Cho et al. |
| 7,465,675 B2 | 12/2008 | Koh |
| 7,551,473 B2 | 6/2009 | Lung et al. |
| 7,623,370 B2 | 11/2009 | Toda et al. |
| 7,651,906 B2 | 1/2010 | Park et al. |
| 7,851,849 B2 | 12/2010 | Kiyotoshi |
| 8,405,061 B2 * | 3/2013 | Yasutake .................. 257/3 |
| 2003/0073262 A1 | 4/2003 | Xu et al. |
| 2003/0211732 A1 | 11/2003 | Chiang |
| 2005/0029587 A1 | 2/2005 | Harshfield |
| 2005/0270832 A1 | 12/2005 | Chu et al. |
| 2005/0280061 A1 | 12/2005 | Lee |
| 2006/0186483 A1 | 8/2006 | Cho et al. |
| 2006/0273298 A1 | 12/2006 | Petti |
| 2007/0140001 A1 | 6/2007 | Motoi et al. |
| 2008/0073635 A1 | 3/2008 | Kiyotoshi et al. |
| 2008/0096327 A1 | 4/2008 | Lee et al. |
| 2008/0101109 A1 | 5/2008 | Haring-Bolivar et al. |
| 2008/0175032 A1 | 7/2008 | Tanaka et al. |
| 2008/0180994 A1 | 7/2008 | Katsumata et al. |
| 2008/0247230 A1 | 10/2008 | Lee et al. |
| 2008/0280401 A1 | 11/2008 | Burr et al. |
| 2008/0285350 A1 | 11/2008 | Yeh |
| 2009/0017577 A1 | 1/2009 | An et al. |
| 2009/0097321 A1 | 4/2009 | Kim et al. |
| 2009/0166600 A1 | 7/2009 | Park et al. |
| 2009/0184360 A1 | 7/2009 | Jin et al. |
| 2010/0270593 A1 | 10/2010 | Lung et al. |
| 2011/0049465 A1 * | 3/2011 | Nagashima ............... 257/5 |
| 2012/0228579 A1 * | 9/2012 | Bandyopadhyay et al. ...... 257/5 |
| 2013/0010520 A1 * | 1/2013 | Murooka ................... 365/148 |
| 2013/0126822 A1 * | 5/2013 | Pellizzer et al. ............. 257/5 |
| 2013/0163323 A1 * | 6/2013 | Yasutake .................. 365/163 |
| 2013/0187114 A1 * | 7/2013 | Kai et al. ................. 257/3 |
| 2013/0193402 A1 * | 8/2013 | Ryu ........................ 257/5 |
| 2013/0328009 A1 * | 12/2013 | Miyagawa et al. .......... 257/4 |

OTHER PUBLICATIONS

Jung et al., "Three Dimensionally Stacked NAND Flash Memory Technology Using Stackin Single Crystal Si Layers on ILD and TANOS Structure for Beyond 30nm Node," IEEE IEDM, Dec. 11-13, 2006, 4 pages.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Paul et al., "Impact of a Process Variation on Nanowire and Nanotube Device Performance," IEEE Trans. on Electron Devices, vol. 54, No. 9, Sep. 2007, pp. 2369-2376.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Fukuzumi et al. "Optimal Integration and Characteristics of Vertical Array Devices for Ultra-High Density, Bit-Cost Scalable Flash Memory," IEEE Dec. 2007, pp. 449-452.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

* cited by examiner

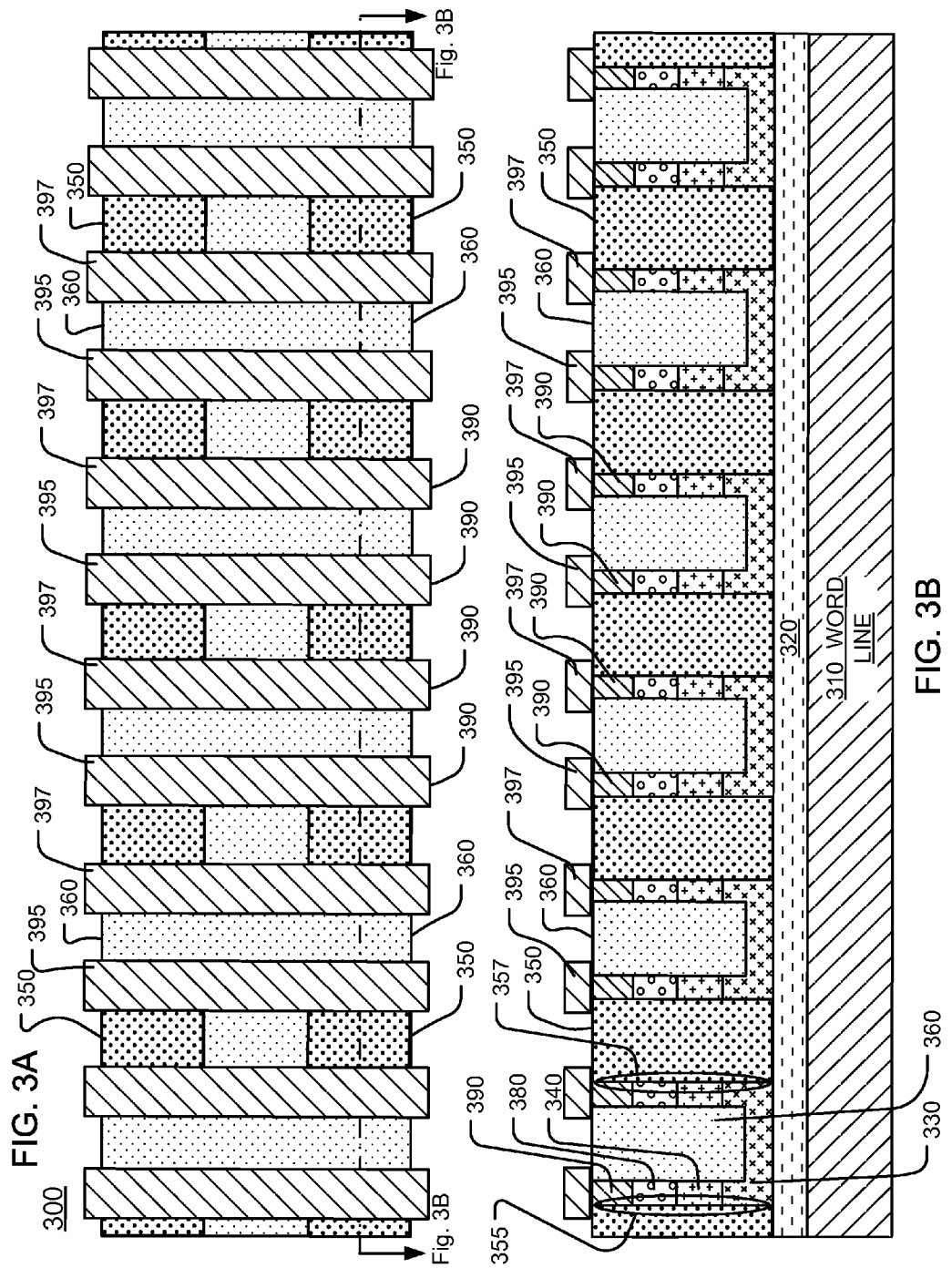

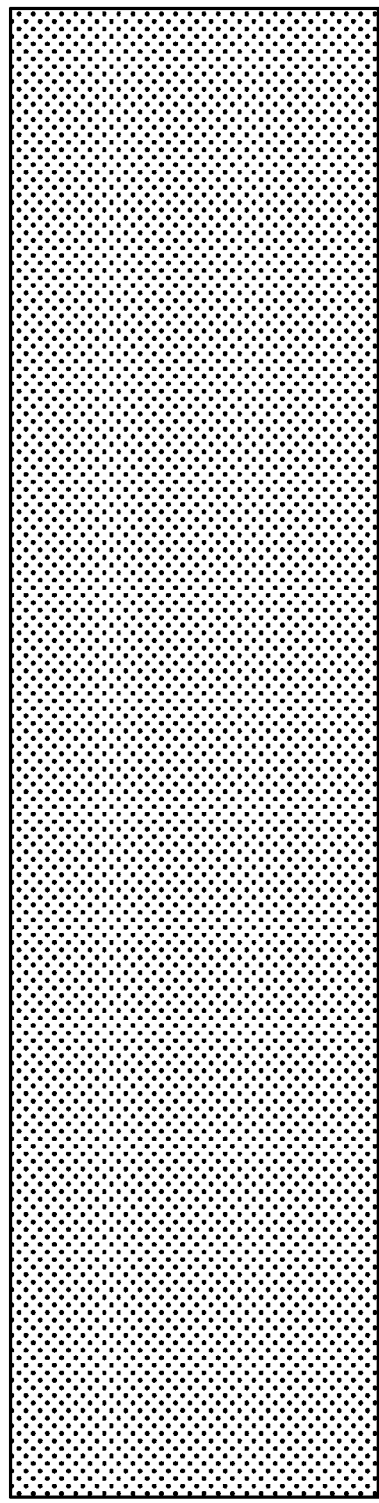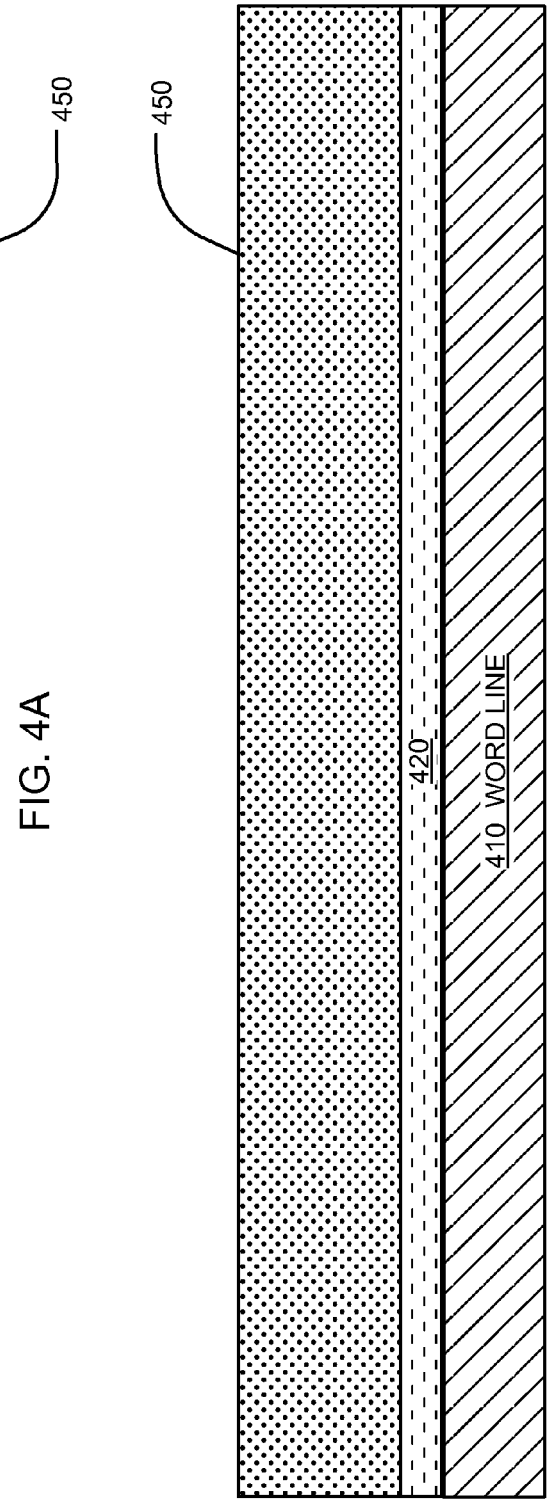

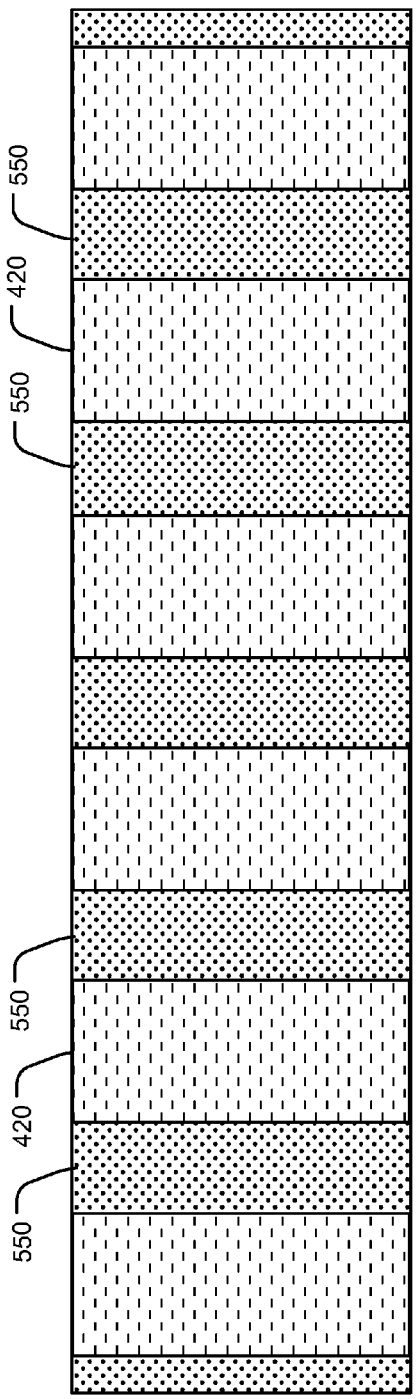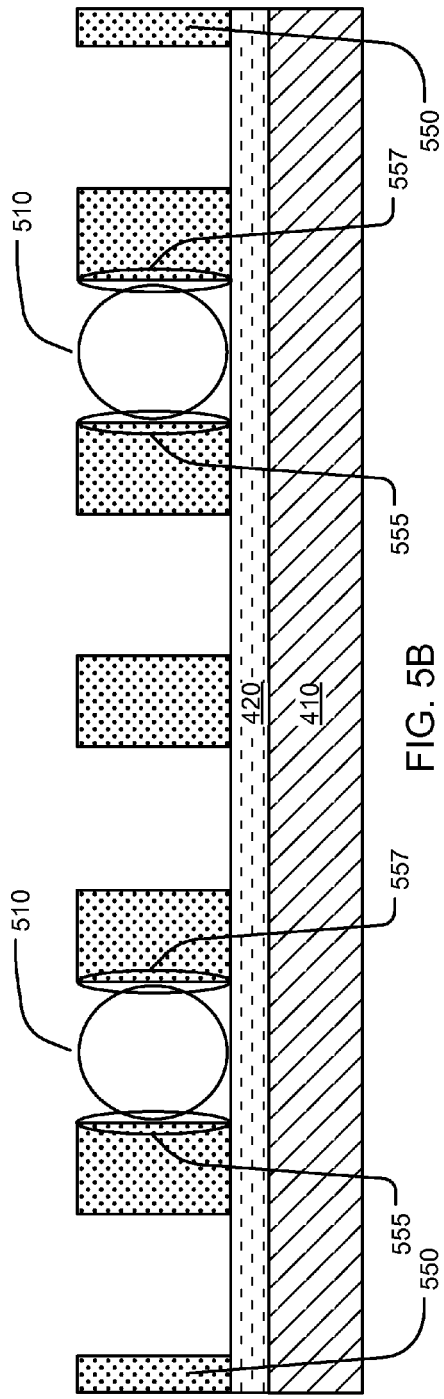
FIG. 5A
FIG. 5B

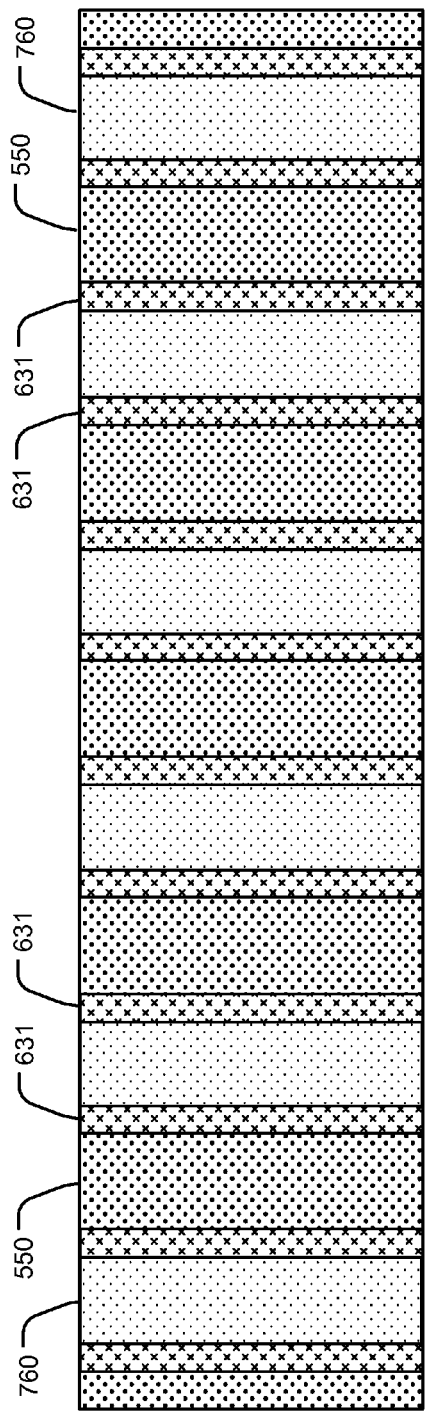
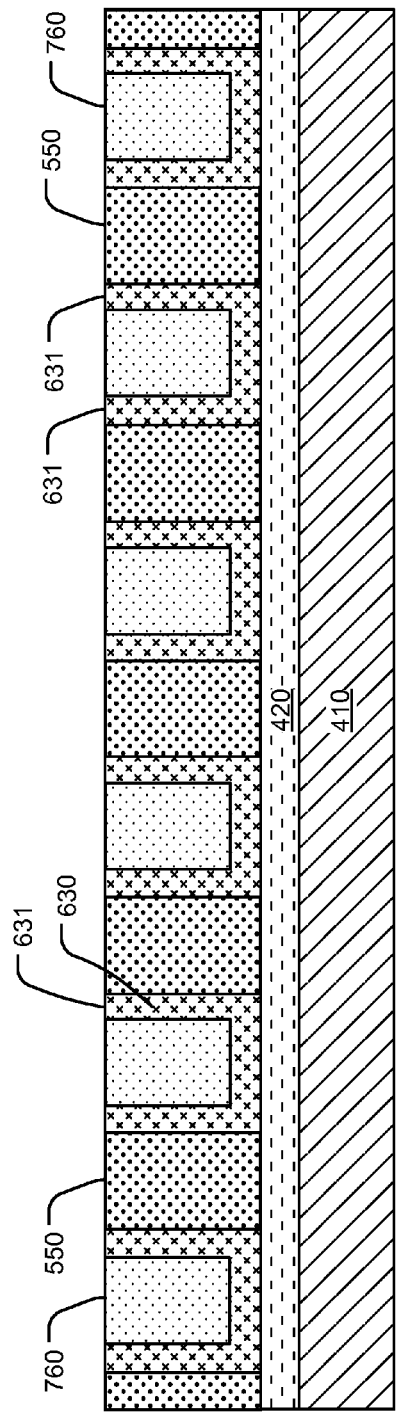
FIG. 8A
FIG. 8B

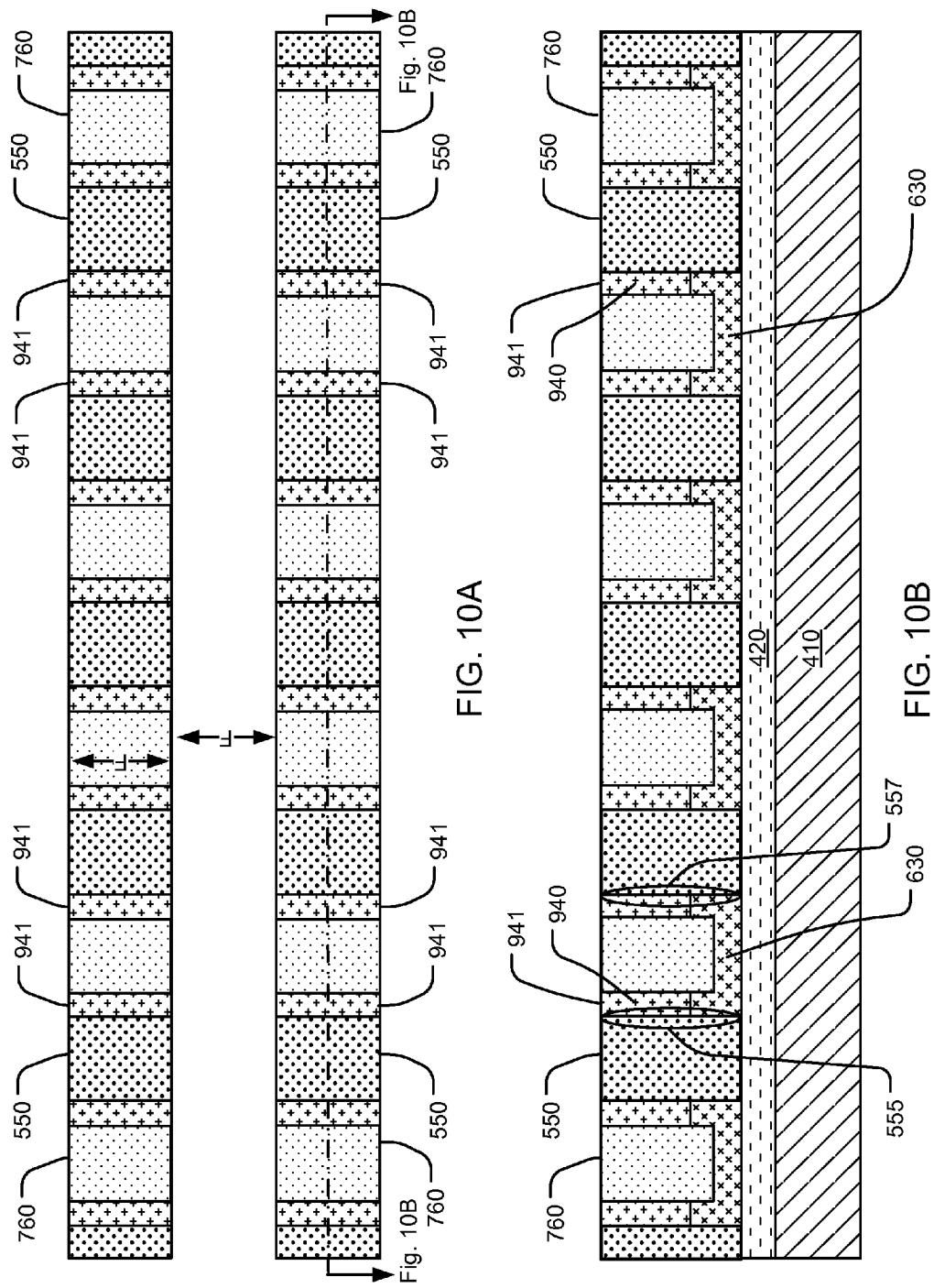

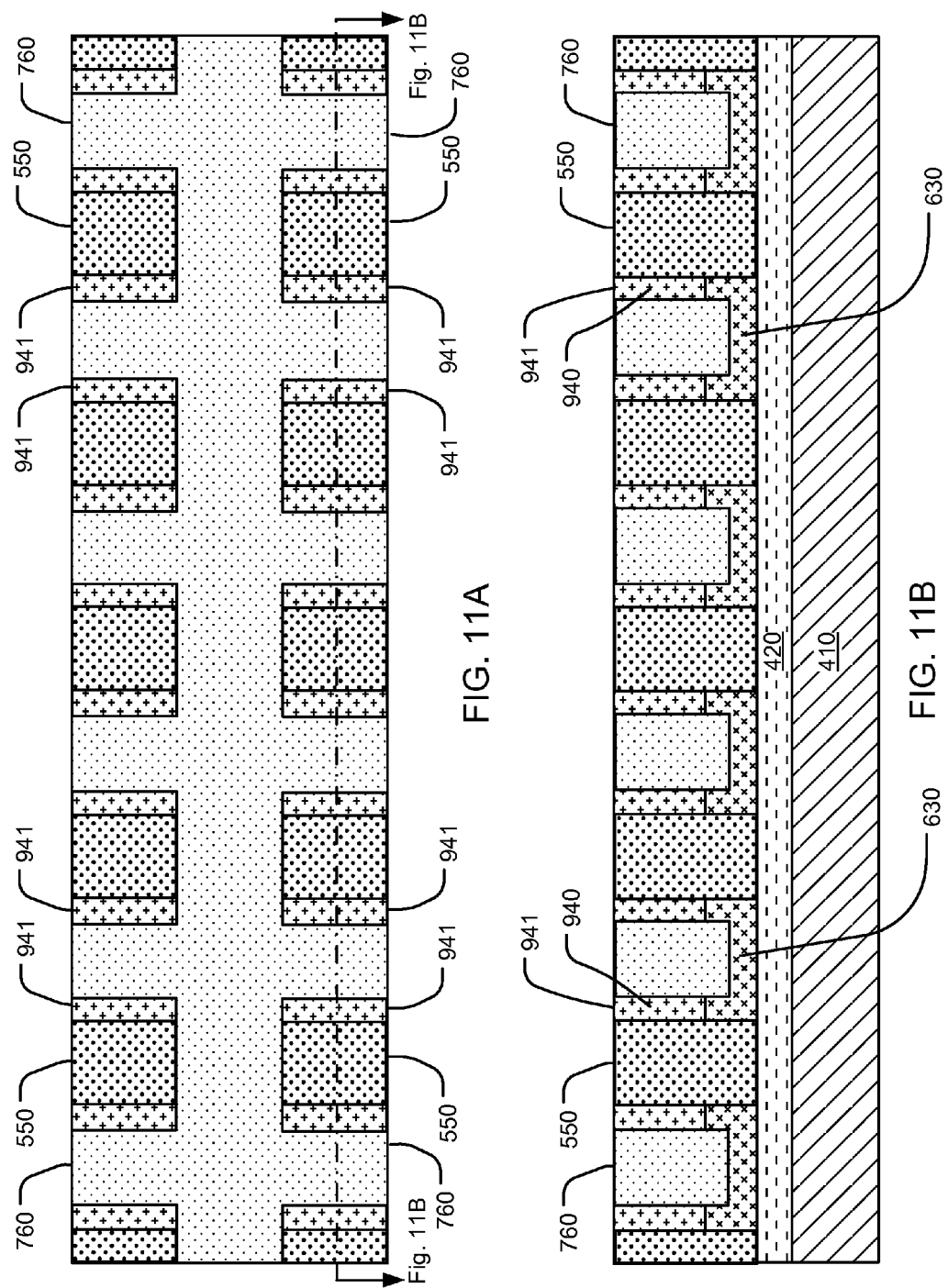

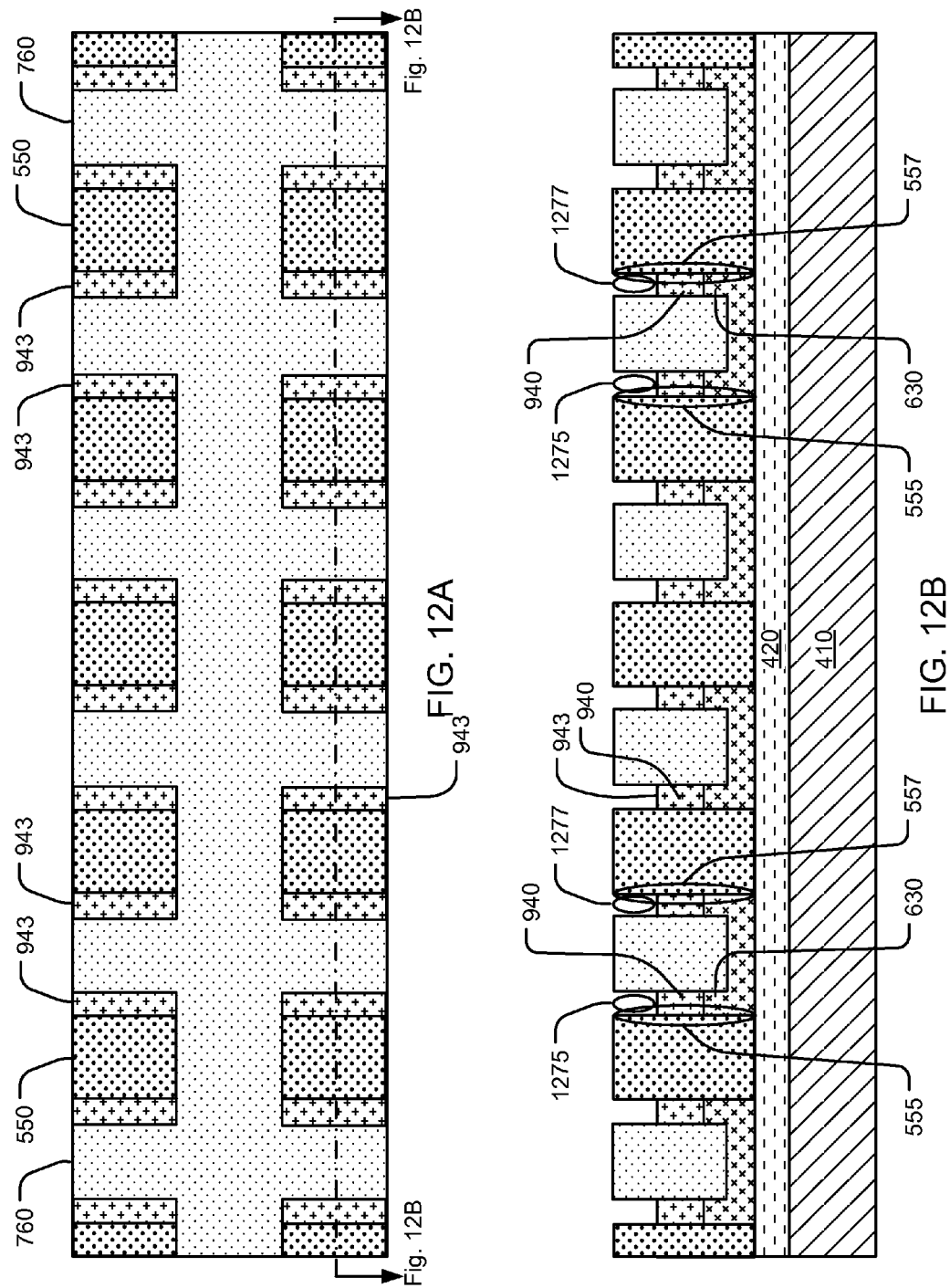

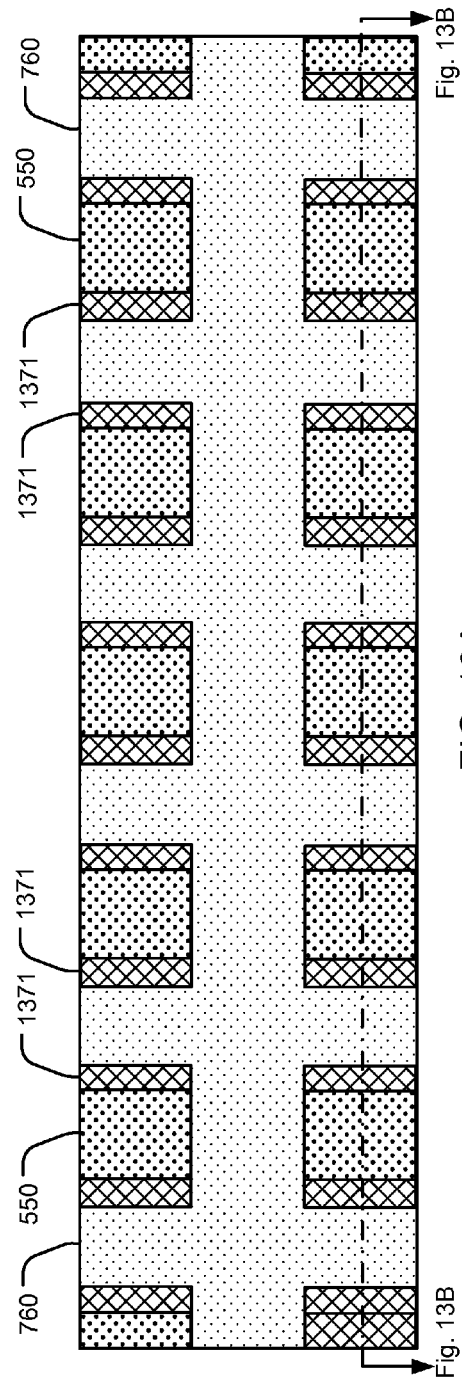
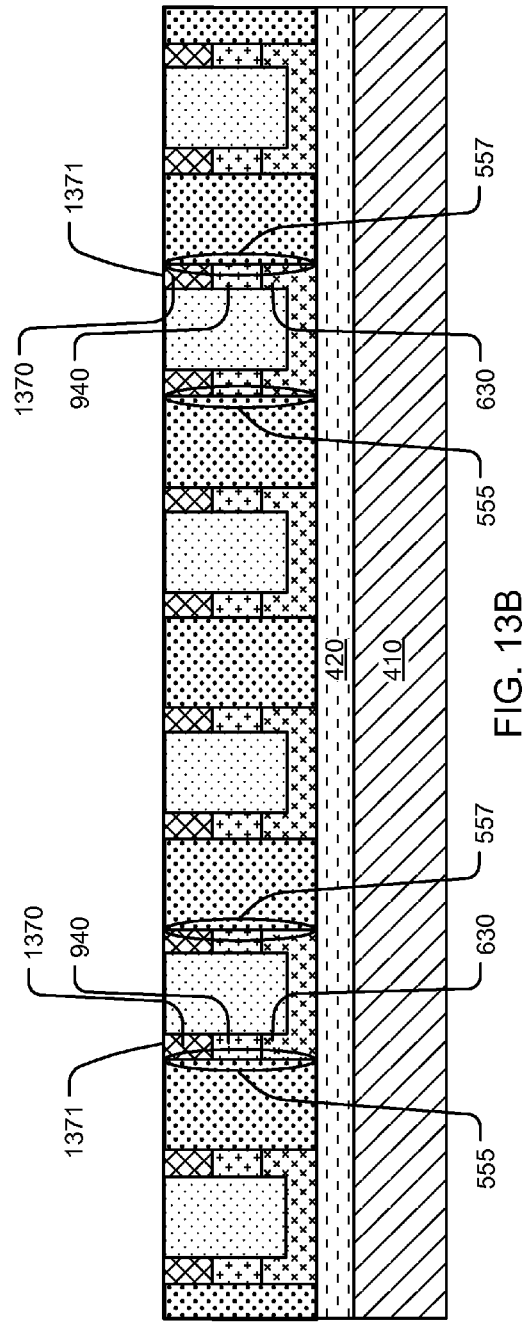
FIG. 13A
FIG. 13B

SIDEWALL DIODE DRIVING DEVICE AND MEMORY USING SAME

BACKGROUND OF THE INVENTION

1. Field of the Invention

The present technology relates to high density memory devices based on phase change memory materials, like chalcogenides, and on other programmable resistance materials, and methods for manufacturing such devices.

2. Description of Related Art

In some programmable resistance memory array configurations, each memory cell includes a diode in series with a phase change memory element. The diode acts as a driving device, so that memory cells can be selected for operation by forward bias on the diode, while current flow in unselected memory cells is blocked by reverse bias on the diode. The phase change memory element is made of phase change materials that exhibit a large resistivity contrast between crystalline (low resistivity) and amorphous (high resistivity) states.

In normal operation of a phase change memory element, an electrical current pulse passed through the phase change memory cell and the diode driving device can set or reset the phase change memory element. To reset the memory element into the amorphous phase, an electrical current pulse with a large magnitude for a short time period can be used to heat up an active region of the memory element to a melting temperature, and then cause it to solidify in the amorphous phase. To set the memory element into the crystalline phase, an electrical current pulse with a medium magnitude, which causes it to heat up to a crystallization transition temperature, and a longer time period can be used allowing the active region to solidify in a crystalline phase. To read the state of the memory element, a small voltage is applied to the selected cell and the resulting electrical current is sensed.

Diodes have been used as semiconductor memory driving devices. Typically, manufacturing technology used to make diode driving devices includes line patterning or hole fill-in. Such technology can require advanced lithography tools or multiple patterning processes to make diodes on small scales and accordingly is not suitable for scalability.

It is desirable to provide diode driving device structures for scalability in high density memory devices.

SUMMARY

A memory device is described including a first conductor, a diode, a memory element and a second conductor arranged in series, wherein the diode includes a P-N junction in a sidewall semiconductor layer. The diode has first and second terminals with a P-N junction in between the terminals, where the P-N junction is in the sidewall semiconductor layer on a sidewall of a patterned insulating layer. For example, the first terminal comprises a semiconductor layer over and in electrical communication with the first conductor. A patterned insulating layer has a sidewall over the first semiconductor layer. The diode can include an intermediate semiconductor layer on a first portion of the sidewall, and in contact with the first semiconductor layer having a lower carrier concentration than the first semiconductor layer, and can be an intrinsic semiconductor. A second semiconductor layer on a second portion of the sidewall provides a second terminal of the diode. A memory element is electrically coupled to the second semiconductor layer. The second conductor is electrically coupled to the memory element.

Other aspects and advantages of the present technology can be seen on review of the drawings, the detailed description and the claims, which follow.

BRIEF DESCRIPTION OF THE DRAWINGS

FIGS. 3A and 3B illustrate a portion of an array of alternative memory cells using sidewall diode driving devices.

FIGS. 4A and 4B through 14A and 14B are top views and cross-sectional views illustrating a method for manufacturing a memory device using a sidewall diode driving device.

FIGS. 15A and 15B through 16A and 16B are top views and cross-sectional views illustrating a method for manufacturing a memory device using a fully self-aligned memory cell.

DETAILED DESCRIPTION

A detailed description of embodiments of memory technology is provided with reference to the FIGS. 1 through 18. Preferred embodiments are described to illustrate an invention or inventions described herein, not to limit its or their scope, which is defined by the claims. Those of ordinary skill in the art will recognize a variety of equivalent variations on the description that follows.

Sidewall diode driving devices for use with high density memory devices are described. A memory array using sidewall diode driving devices includes a plurality of first access lines, the first access lines including a first conductor. A patterned insulating layer on the plurality of first access lines includes a sidewall, such as can be formed using a plurality of trenches having first and second sidewalls or other openings in the layer. Sidewall semiconductor layers are formed on the sidewall. A sidewall semiconductor layer as the term is used herein is a thin film layer deposited over the sidewall structure, having a thickness measured perpendicular to the sidewall that is determined primarily by the thickness of the thin film rather than by a patterned etch or other patterning step.

In examples described below, a first semiconductor layer is disposed on the first conductor below the patterned insulating layer. Intermediate semiconductor layers are disposed on first portions of the sidewall, and in contact with the first semiconductor layer. Second semiconductor layers are disposed on second portions of the sidewall, and in contact with the intermediate semiconductor layers.

Memory elements are disposed in electrical communication with the second semiconductor layers. A plurality of second access lines is disposed over the memory elements, and in electrical communication with the memory elements.

Figure 1A:
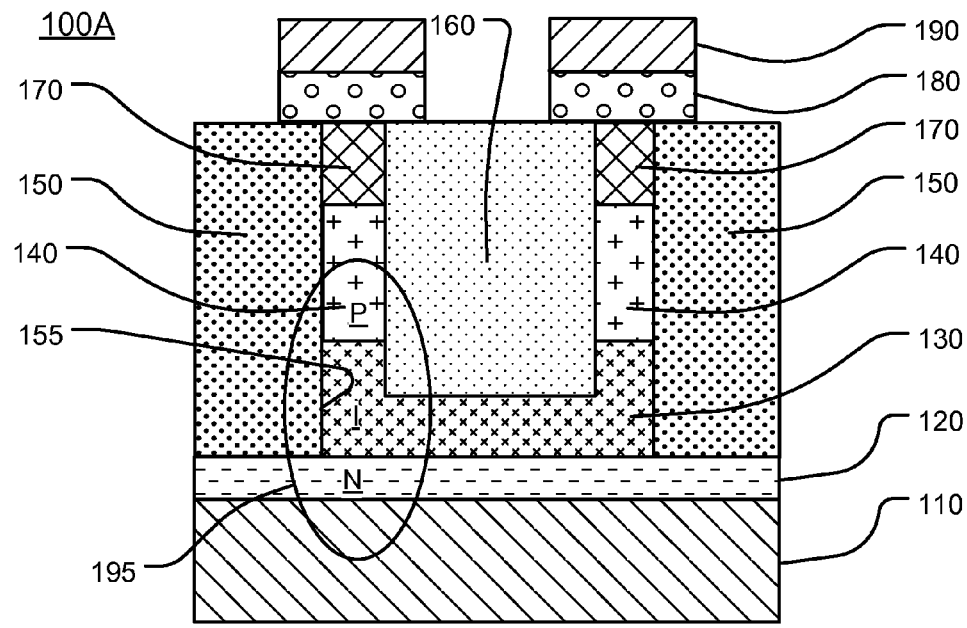
FIG. 1A illustrates an example memory cell using a sidewall diode driving device.

FIG. 1A illustrates an example memory cell using a sidewall diode driving device in a memory device 100A. The sidewall diode driving device may use polysilicon, single crystal silicon, or other suitable semiconductor materials. The memory device 100A includes a first conductor 110, a diode 195, a memory element 180, and a second conductor 190 arranged in series. The diode 195 includes a first semiconductor layer 120 over and in electrical communication with the first conductor 110. A patterned insulating layer 150 has a sidewall 155 over the first semiconductor layer 120. The diode 195 includes an intermediate semiconductor layer 130 on a first portion of the sidewall 155, and in contact with the first semiconductor layer 120. The intermediate semiconductor layer 130 has a lower carrier concentration, of opposite type, than the first semiconductor layer 120, such as a carrier concentration that between $10^{-2}$ and $10^{-5}$ carriers/cm$^3$, or less, times that of the first semiconductor layer 120. In the illustrated embodiment, the intermediate semiconductor layer 130 comprises an intrinsic (I) semiconductor. A second semiconductor layer 140 on a second portion of the sidewall 155, and in contact with the intermediate semiconductor layer 130, has a higher carrier concentration than the intermediate semiconductor layer 130. In this example the P-N junction is in the sidewall semiconductor layers 130, 130b, as a result of the fact that the majority of the depletion region of the junction extends into the more lightly doped, or intrinsic, intermediate semiconductor layers 130, 130b from the more highly doped, first semiconductor layer 120b.

In some embodiments, the P-N junction for the diode can be implemented without using the intermediate layer or the second semiconductor layer. In some embodiments, a silicide layer is formed on the second terminal of the diode, using for example a SAlicide process, on the second terminal of the diode, such as cobalt silicide, nickel silicide, titanium silicide, platinum silicide, or other silicon/metal material.

The memory device 100A includes a layer of electrode material 170 on a third portion of the sidewall 155. The memory element 180 is disposed over the patterned insulating layer 150 in contact with the layer of electrode material 170, such as titanium nitride, tantalum nitride, tungsten, or other heater materials utilized in phase change memory technologies. The second conductor 190 is disposed over and in contact with the memory element 180. The first conductor 110 includes one of a word line or bit line. The second conductor 190 includes another of a word line or a bit line. The intermediate semiconductor layer 130, the second semiconductor layer 140, and the layer of electrode material 170, are surrounded by an insulating fill material 160 on a side opposite the sidewall 155.

The intermediate semiconductor layer 130 and the second semiconductor layer 140 can have thicknesses less than 10 nanometers (nm). The first semiconductor layer 120 can include N+ polysilicon (e.g., having n-type doping on the order of $10^{17}$ or $10^{19}$/cm$^3$ or greater), and the second semiconductor layer 140 can include P+ polysilicon (e.g., having p-type doping on the order of $10^{13}$ or $10^{16}$/cm$^3$ or greater). The memory element 180 may include a programmable resistance material, such as a phase change material.

Figure 1B:
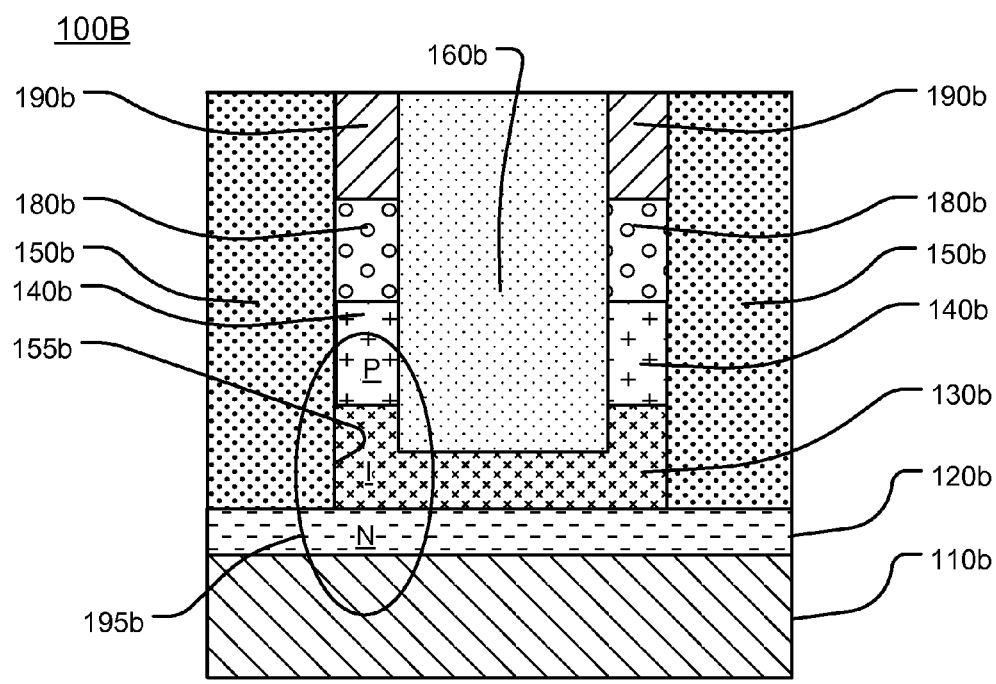
FIG. 1B illustrates an example memory cell using a fully self-aligned memory cell.

FIG. 1B illustrates an example memory cell using a fully self-aligned memory cell in a memory device 100B. The memory device 100B has a memory element and a second conductor on the same sidewall with a corresponding sidewall diode driving device. In comparison, the memory device 100A for FIG. 1A has the diode 195 on the sidewall 155 while the corresponding memory element 180 is disposed over the sidewall 155. In some embodiments, a layer of electrode material (not shown), such as titanium nitride, tantalum nitride, tungsten or other heater materials utilized in phase change memory technologies, can be formed between the second terminal of the diode and the memory material. In some embodiments, a silicide layer is formed on the second terminal of the diode, using for example a salicide process, on the second terminal of the diode, such as cobalt silicide, nickel silicide, titanium silicide, platinum silicide, or other silicon/metal material.

The memory device 100B includes a first conductor 110b, a diode 195b, a layer of memory material 180b, and a second conductor 190b arranged in series. The diode 195b includes a first semiconductor layer 120b over and in electrical communication with the first conductor 110b. A patterned insulating layer 150b has a sidewall 155b over the first semiconductor layer 120b. The diode 195b includes in this example, an intermediate semiconductor layer 130b on a first portion of the sidewall 155b, and in contact with the first semiconductor layer 120b. The intermediate semiconductor layer 130b can be an N− layer semiconductor having a lower carrier concentration than the first semiconductor layer 120b. In one embodiment, the intermediate semiconductor layer 130b comprises an intrinsic semiconductor, so that the sidewall diode is a PIN diode. A second semiconductor layer 140b on a second portion of the sidewall 155b, and in contact with the intermediate semiconductor layer 130b, has a higher carrier concentration than the intermediate semiconductor layer 130b. The second diode 195b is mirror image symmetrical (within manufacturing tolerances) with said first mentioned diode 195 in structures when made as described herein.

The memory device 100B includes a layer of memory material 180b on a third portion of the sidewall 155b in electrical communication with the second semiconductor layer 140b, and a layer of electrode material 190b on a fourth portion of the sidewall 155b in contact with the layer of memory material 180b. The first conductor 110b includes one of a word line or bit line. The layer of electrode material 190b includes another of a word line or a bit line. The intermediate semiconductor layer 130b, the second semiconductor layer 140b, the layer of memory material 180b, and the layer of electrode material 190b, are surrounded by an insulating fill material 160b on a side opposite the sidewall 155b. In some embodiments, a silicide layer (not shown) is formed on the top surface of layer 140b, acting as the second terminal of the diode, using for example a SAlicide process, on the second terminal of the diode, such as cobalt silicide, nickel silicide, titanium silicide, platinum silicide, or other silicon/metal material. In some embodiments, a layer of electrode material or heater material (not shown), such as titanium nitride, tantalum nitride, tungsten or other heater materials utilized in phase change memory technologies, can be formed between the second terminal of the diode and the memory material.

The intermediate semiconductor layer 130b and the second semiconductor layer 140b can have thicknesses less than 10 nanometers. The layer of memory material 180b can have a thickness substantially the same as the thickness of the second semiconductor layer 140b. The first semiconductor layer 120b can include N+ polysilicon, and the second semiconductor layer 140b can include P+ polysilicon. The layer of memory material 180b may include a programmable resistance material, such a phase change material.

Figures 2A, 2B:
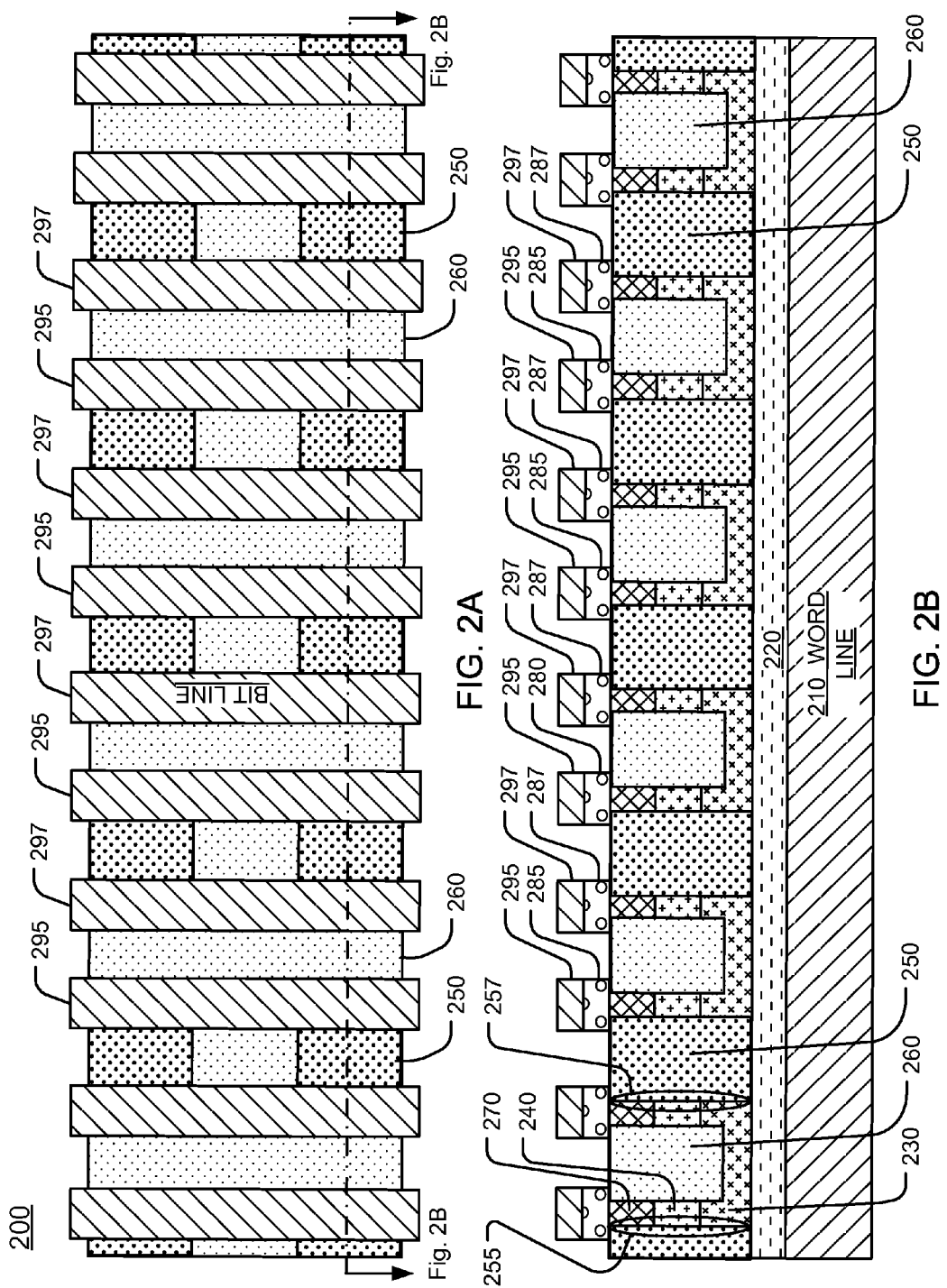
FIGS. 2A and 2B illustrate a portion of an array of memory cells using sidewall diode driving devices.

FIGS. 2A and 2B illustrate a portion of an array of memory cells using sidewall diode driving devices in a memory device 200. FIG. 2A is a top view of the array of memory cells. FIG. 2B is a cross-sectional view of the array of memory cells. The memory device 200 includes a plurality of first access lines, the first access lines including a first conductor 210. A first semiconductor layer 220 is disposed on the first conductor 210. A patterned insulating layer 250 on the plurality of first access lines 210 includes first and second sidewalls 255 and 257, such as can be formed using a plurality of trenches. The first and second sidewalls 255 and 257 extend through the patterned insulating layer 250 to the first semiconductor layer 220.

Intermediate semiconductor layers 230 are disposed on first portions of the first and second sidewalls 255 and 257 in the plurality of trenches, and in contact with the first semiconductor layer 220. The intermediate semiconductor layers 230 have lower carrier concentrations than the corresponding first semiconductor layers 220.

Second semiconductor layers 240 are disposed on second portions of the first and second sidewalls 255 and 257 in the plurality of trenches, and in contact with the intermediate semiconductor layers 230. The second semiconductor layers 240 have higher carrier concentrations than corresponding intermediate semiconductor layers.

First and second memory elements 285 and 287 are disposed over the patterned insulating layer 250, and in electrical communication with the second semiconductor layers 240. First top conductors 295 and second top conductors 297, acting as a plurality of second access lines, are disposed over the first and second memory elements 285 and 287, and in electrical communication with the first and second memory elements 285 and 287. The plurality of first access lines 210 may include bit lines and the plurality of second access lines may include word lines. Alternatively, the plurality of first access lines 210 may include word lines and the plurality of second access lines may include bit lines.

The memory device 200 includes layers of electrode material 270 on corresponding third portions of the first and second sidewalls 255 and 257, over the second semiconductor layers 240. The first and second memory elements 285 and 287 are disposed over the patterned insulating layer 250 in contact with the layers of electrode material 270. An insulating fill material 260 fills the area between a structure formed by the intermediate semiconductor layers 230, the second semiconductor layers 240, and the layers of electrode material 270 on the first sidewall 255, and another structure formed by the intermediate semiconductor layers 230, the second semiconductor layers 240, and the layers of electrode material 270 on the second sidewall 257.

The intermediate semiconductor layers 230 and the second semiconductor layers 240 can have thicknesses less than 10 nanometers. The first semiconductor layers 220 can include N+ polysilicon. The intermediate semiconductor layers 230 can include intrinsic polysilicon. The second semiconductor layers 240 can include P+ polysilicon. The first and second memory elements 285 and 287 may include a programmable resistance material, such as a phase change material.

The patterned insulating layer 250 includes a plurality of trenches, one of the plurality of trenches including the first sidewall 255 and the opposing second sidewall 257. A semiconductor layer is formed on the first sidewall 255 and the opposing second sidewall 257, and in contact with the first semiconductor layer 220. The semiconductor layer includes the intermediate semiconductor layer 230 on first portions of the first sidewall 255 and the opposing second sidewall 257 in contact with the first semiconductor layer 220, and the second semiconductor layers 240 over the intermediate semiconductor layer 230 and on second portions of the first sidewall 255 and opposing second sidewall 257.

The first memory element 285 is in electrical communication via the electrode material 270 with the second semiconductor layer 240 of the semiconductor layer on the first sidewall 255, and the second memory element 287 is in electrical communication via the electrode material 270 with the second semiconductor layer 240 of the semiconductor layer on the sidewall 557. The first top conductors 295 and second top conductors 297 are disposed over and in electrical communication with the first memory element 285 and the second memory element 287, respectively. The first and second top conductors 295 and 297 have a common width over the first and second memory elements 285 and 287, and the first sidewall 255 and the opposing second sidewall 257 are separated by about two times the common width, or less.

FIGS. 3A and 3B illustrate a portion of an array of memory cells using alternative sidewall diode driving devices in a memory device 300. FIG. 3A is a top view of the array of memory cells. FIG. 3B is a cross-sectional view of the array of memory cells. The memory device 300 includes a plurality of first access lines, the first access lines including a first conductor (word line 310). A first semiconductor layer 320 is disposed on the first conductor 310. A patterned insulating layer 350 on the plurality of first access lines 310 includes first and second sidewalls 355 and 357, such as can be formed using a plurality of trenches. The first and second sidewalls 355 and 357 extend through the patterned insulating layer 350 to the first semiconductor layer 320.

Intermediate semiconductor layers 330 are disposed on first portions of the first and second sidewalls 355 and 357 in the plurality of trenches, and in contact with the first semiconductor layer 320. The intermediate semiconductor layers 330 have lower carrier concentrations than the corresponding first semiconductor layers 320.

Second semiconductor layers 340 are disposed on second portions of the first and second sidewalls 355 and 357 in the plurality of trenches, and in contact with the intermediate semiconductor layers 330. The second semiconductor layers 340 have higher carrier concentrations than corresponding intermediate semiconductor layers.

Memory elements include layers of memory material 380 on corresponding third portions of the first and second sidewalls 355 and 357 in the plurality of trenches, and include layers of electrode material 390 on corresponding fourth portions of the first and second sidewalls 355 and 357, over the layers of memory material 380. The layers of memory material 380 are in contact with the second semiconductor layers 340. The layers of electrode material 390 are in electrical communication with the layers of memory material 380. First top conductors 395 and second top conductors 397, acting as a plurality of second access lines (e.g. bit lines), are disposed over and in contact with the layers of electrode material 390.

An insulating fill material 360 fills the area between a structure formed by the intermediate semiconductor layers 330, the second semiconductor layers 340, the layers of memory material 380, and the layers of electrode material 390 on the first sidewall 355, and another structure formed by the intermediate semiconductor layers 330, the second semiconductor layers 340, the layers of memory material 380, and the layers of electrode material 390 on the second sidewall 357.

The intermediate semiconductor layers 330 and the second semiconductor layers 340 can have thicknesses less than 10 nanometers. The layers of memory material 380 can have a thickness substantially the same as the thickness of the second semiconductor layer 340. The first semiconductor layers 320 can include N+ polysilicon. The intermediate semiconductor layers 330 can include intrinsic polysilicon. The second semiconductor layers 340 can include P+ polysilicon. The memory material 380 may include a programmable resistance material, such as a phase change material.

FIGS. 4A and 4B through 14A and 14B are top views and cross-sectional views illustrating a method for manufacturing a memory device using a sidewall diode driving device as described above. In reference to FIGS. 4A and 4B, the method forms a blanket layer 410 of first conductor material, and a blanket layer 420 of a first doped semiconductor material on layer 410. The conductor layer 410 can comprise materials suitable for use as a word line including for example, materials such as tungsten, titanium nitride, aluminum, copper, tantalum nitride. The semiconductor layer 420 can comprise doped polysilicon, for example or other semiconductor materials. An insulating layer 450 comprising for example a silicon oxide or other dielectric material, is deposited over the first semiconductor layer 420. FIG. 4A illustrates a top view of the insulating layer 450. The first conductor 410 may be configured as a word line or a bit line.

In reference to FIGS. 5A and 5B, the method patterns the insulating layer 450 to form a patterned insulating layer 550 having a sidewall over the blanket layer 420 of the first doped semiconductor material. The patterned insulating layer 550 includes a plurality of trenches 510, one of the plurality of trenches including a sidewall 555 and an opposing sidewall 557, where the trenches are examples of openings over and exposing the first semiconductor layer 420. FIG. 5A illustrates portions of the blanket layer 420 of the first doped semiconductor material exposed by the plurality of trenches 510 and surrounded by the patterned insulating layer 550. Although the first semiconductor layer is continuous along the first conductors in this embodiment, and thus can be patterned in a single step, in other embodiments, the first semiconductor layer can be segmented on a cell-by-cell basis, or for groups of cells along the conductor.

Figure 6A:
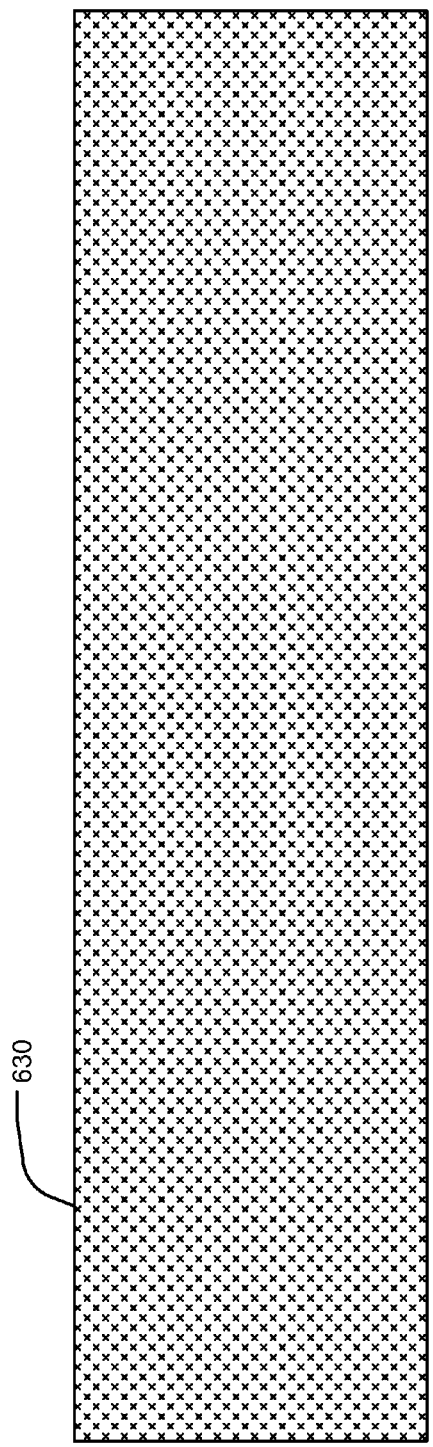
Figure 6B:
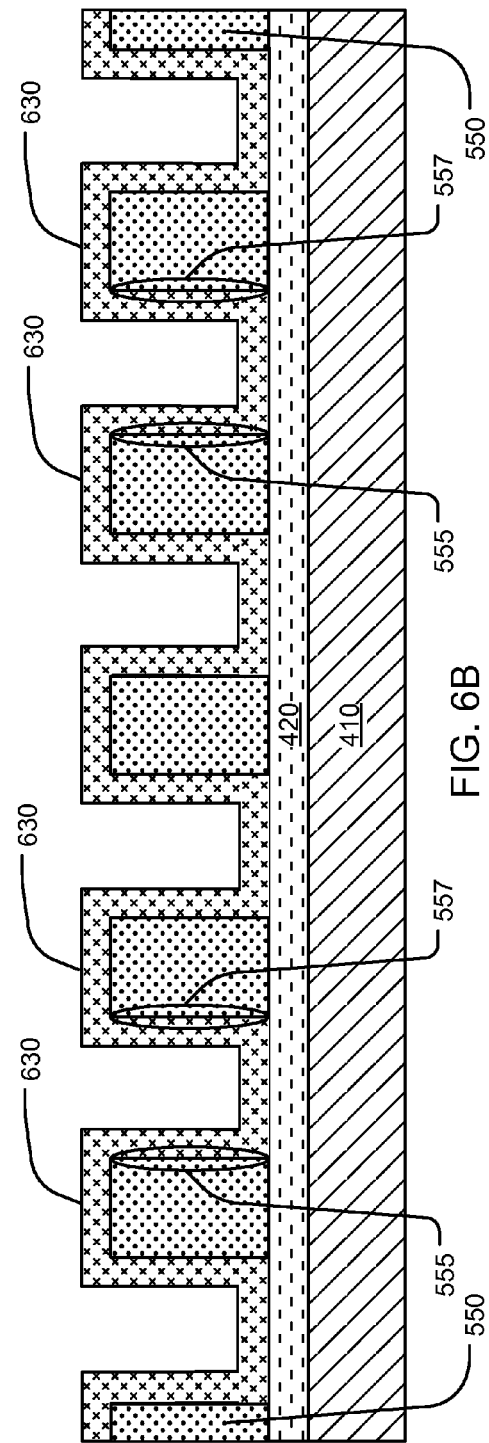

In reference to FIGS. 6A and 6B, the method forms a semiconductor layer 630 on the sidewall 555 and the opposing sidewall 557, in contact with the first semiconductor layer 420 where it is exposed by the plurality of trenches 510, and over the patterned insulating layer 550. FIG. 6A illustrates a top view showing a blanket deposition of the semiconductor layer 630. The semiconductor layer 630 includes an intrinsic semiconductor material in some embodiments, or a lightly semiconductor layer in other embodiments. The semiconductor layer 630 has a lower carrier concentration than the first semiconductor layer 420. The semiconductor layer 630 can comprise polysilicon, or other semiconductor materials, including single crystal semiconductors.

Figure 7A:
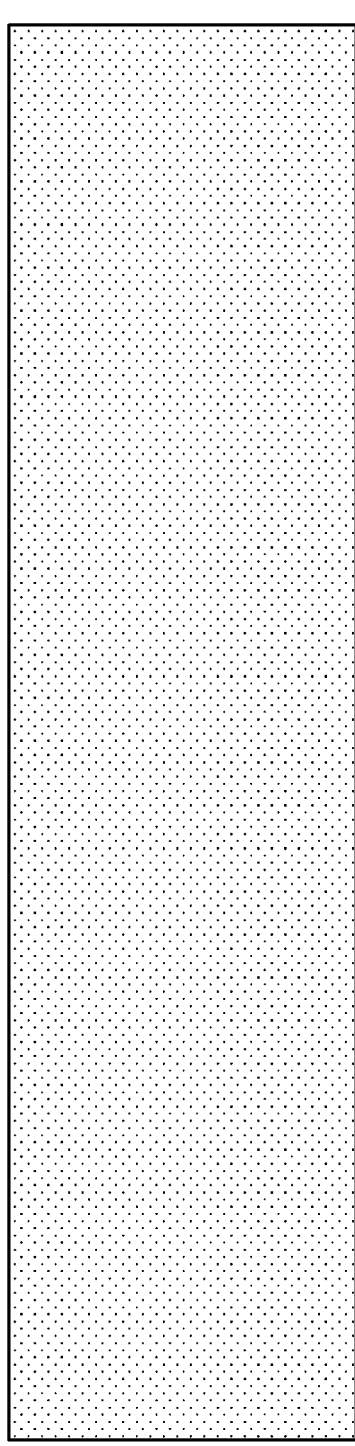
Figure 7B:
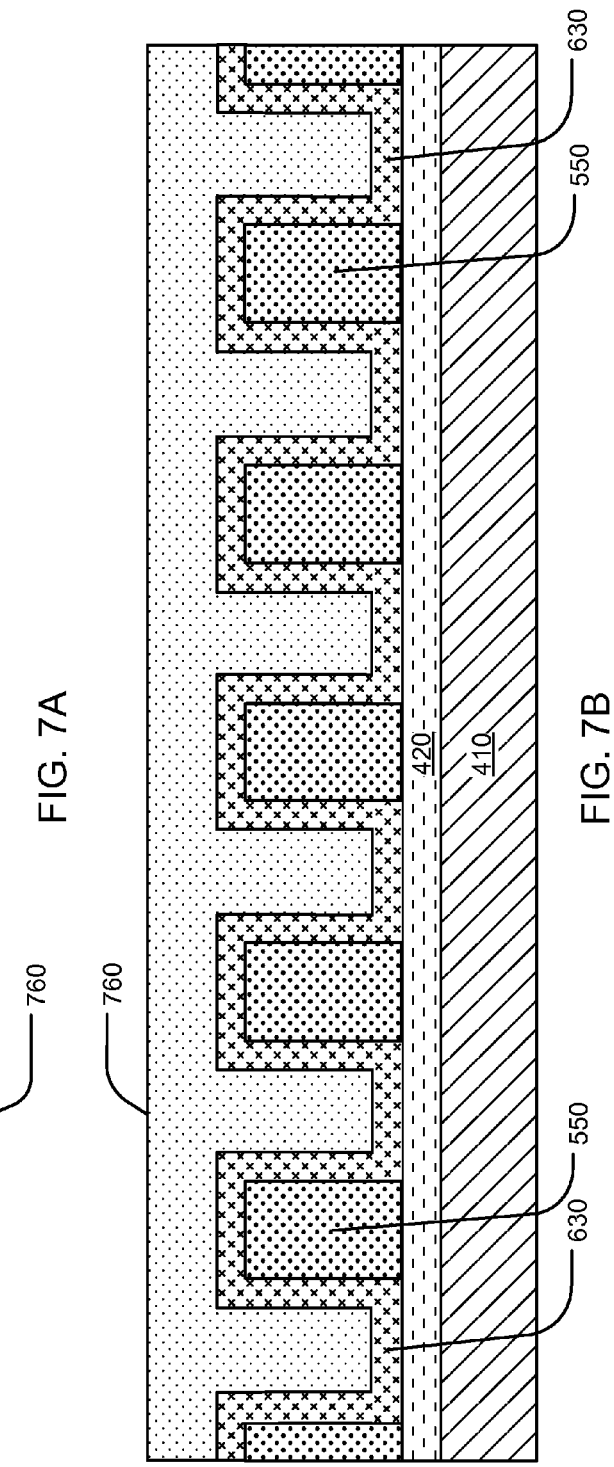

In reference to FIGS. 7A and 7B, the method forms an insulating fill material 760 over the first part 630 of the semiconductor layer. The insulating fill material may include oxide materials comprising for example a silicon oxide or other dielectric material. FIG. 7A illustrates a top view of the insulating fill material 760.

In reference to FIGS. 8A and 8B, the method applies a chemical-mechanical planarization (CMP) process to remove the insulating fill material 760 to expose a top surface 631 of the semiconductor layer 630 co-planar with the patterned insulating layer 550 outside the trenches and the insulating fill material 760 inside the trenches. FIG. 8A is a top view of the memory device illustrating the top surface 631 of the remnants of semiconductor layer 630 surrounded by the patterned insulating layer 550 on one side and by the insulating fill material 760 on another side.

Figure 9A:
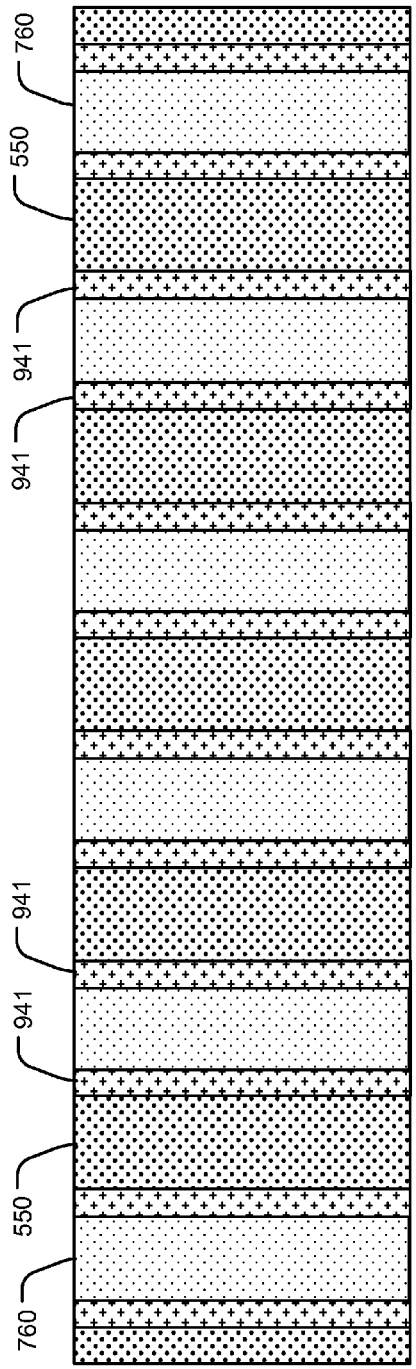
Figure 9B:
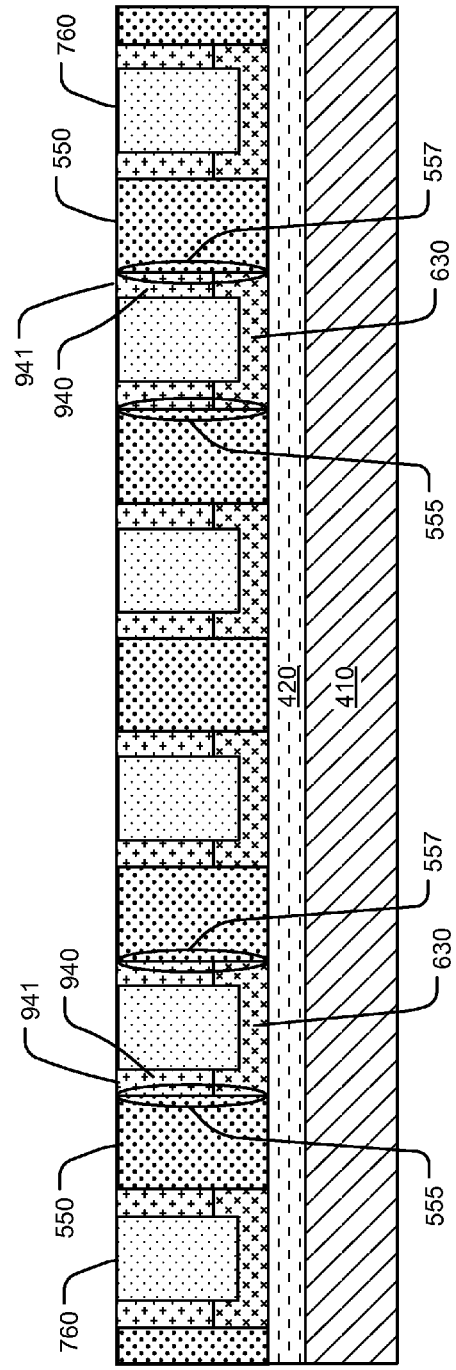

In reference to FIGS. 9A and 9B, the method forms elements 940 on the sidewalls 555, 557, having the opposite carrier type from that of the first layer 420. This can be done for example by implanting impurities in the top portion of the semiconductor layer 630, where the implants do not reach the portions of layer 630, leaving the intermediate semiconductor layer in the structure. FIG. 9A is a top view of the memory device illustrating a top surface 941 of the elements 940 surrounded by the patterned insulating layer 550 on one side and by the insulating fill material 760 on another side. The elements 940 have a carrier concentration higher than portions of the semiconductor layer 630 with which they are in contact along the sidewalls 555, 557.

In reference to FIGS. 10A and 10B, the method applies an etching process to form lines or strips in the stack. FIG. 10A is a top view of the memory device illustrating strips of semiconductor stack structures with space in-between formed by the etching process along the direction of the first conductor 410. FIG. 10B is a cross-sectional view taken through isolated sidewall diode driving devices showing the stack structure including conductor layer 410, first semiconductor layer 420, patterned insulating layer 550 and fill material 760, the semiconductor layer 630 and the semiconductor fill 940, forming a plurality of first conductor lines on an underlying substrate (not shown). The strips can have a common width and a common spacing between the strips, and the sidewall 555 and the opposing sidewall 557 can be separated by about two times the common width of the strips, or less. This common width of the strips, in some embodiments, can be equal to the minimum feature size "F" achievable using the patterning technology applied during manufacture to defining and etching the strips. Also, the common spacing between the strips, in some embodiments, can be equal to the minimum feature size "F" achievable using the patterning technology applied during manufacture to define and etch the strips. (Drawing not to scale).

In reference to FIG. 11A, the method fills in the space between the strips of semiconductor stack structures with the insulating fill material 760. FIG. 11B is a cross-sectional view taken through isolated sidewall diode driving devices, essentially the same as FIG. 10B.

In reference to FIGS. 12A and 12B, the method removes some of the semiconductor fill 940 to form a recess 1275 abutting the sidewall 555 and a recess 1277 abutting the opposing sidewall 557. As a result of the recesses 1275 and 1277, portions of the semiconductor fill 940 remain, and abut the sidewalls 555, 557 of the trenches. FIG. 12A is a top view of the memory device illustrating a top surface 943 of the remnants of the semiconductor fill 940 through the recesses 1275 and 1277 surrounded by the insulating fill material 760 on one side and by the patterned insulating layer 550 on another side. Reactive ion etching RIE, for example, can be used to form the recess.

In reference to FIGS. 13A and 13B, the method then deposits electrode material 1370 in the recesses 1275 and 1277 on a third portion of the sidewall 555 and on a third portion of the opposing sidewall 557. The structure is then planarized so that top surfaces 1371 of the electrode material 1370 are exposed and co-planar with the patterned insulating layer 550 and the fill material 760. FIG. 13A is a top view of the memory device illustrating a top surface 1371 of the electrode material 1370 surrounded by the insulating fill material 760 on one side and the patterned insulating layer 550 on another side. The electrode material 1370 may include titanium nitride (TiN), tantalum nitride, tungsten or other materials.

The semiconductor layer 630 and the semiconductor fill 940 can have thicknesses less than 10 nanometers. The first doped semiconductor 420 can include N+ polysilicon. The semiconductor layer 630 can include one of N− polysilicon, intrinsic polisilicon, or P− polysilicon. The semiconductor fill 940 can include P+ polysilicon.

Figures 14A, 14B:
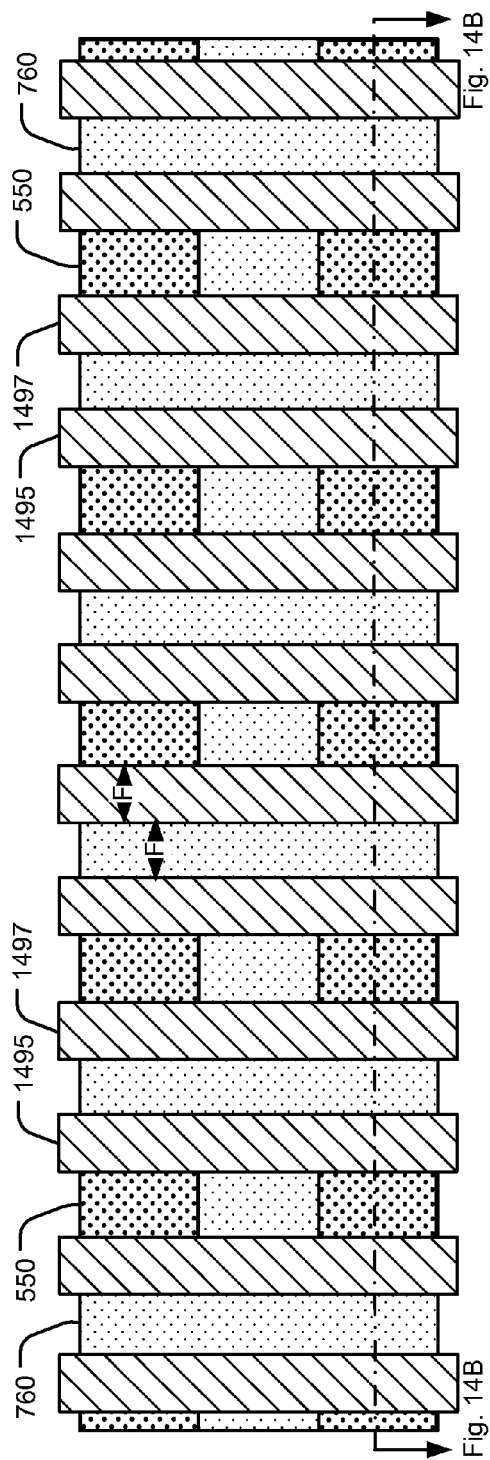

In reference to FIGS. 14A and 14B, the patterned insulating layer 550 includes a plurality of trenches 510 (shown in FIG. 5B), each of the plurality of trenches 510 including the sidewall 555 and the opposing sidewall 557. Forming a semiconductor layer on the sidewall 555 results in formation of the semiconductor layer on the opposing sidewall 557, and in contact with the first semiconductor layer 420. The semiconductor layer includes a first part 630 on a first portion of the opposing sidewall 557 in contact with the first semiconductor layer 420, and a second part 940 over the first part 630 and on a second portion of the opposing sidewall 557. The first part 630 on the opposing sidewall 557 has a carrier concentration lower than the first semiconductor layer 420, and the second part 940 on the opposing sidewall 557 has a carrier concentration higher than the first part 630.

The method forms a first memory element 1485 in electrical communication via the electrode material 1370 with the second part 940 of the semiconductor layer on the sidewall 555, and a second memory element 1487 in electrical communication via the electrode material 1370 with the second part 940 of the semiconductor layer on the opposing sidewall 557. The method provides first and second top conductors 1495 and 1497 over and in electrical communication with the first memory element 1485 and the second memory element 1487, respectively. The first and second top conductors 1495 and 1497 have a common width over the first and second memory elements 1485 and 1487 and a common spacing between the conductors. The sidewall 555 and the opposing sidewall 557 can be separated by about two times the common width, or less. This common width of the first top conductors 1495, in some embodiments, can be equal to the minimum feature size F achievable using the patterning technology applied during manufacture. Also, in some embodiments, the common width of the spacing between the conductors can also be the minimum feature size. (Drawing not to scale). When both the strips of FIGS. 10A and 10B and the first top conductors 1495 of FIGS. 14A and 14B have widths equal to the same minimum feature size F, then area required on the array for each cell can be $4F^2$, yielding very dense arrays. Also, the resulting structure is scalable as F shrinks.

FIG. 14A is a top view of the memory device illustrating that the first and second top conductors 1495 and 1497 span the strips of semiconductor including isolated sidewall diode driving devices. After forming the first top conductors 1495, the balance of the integrated circuit manufacturing processes can be completed.

FIGS. 15A and 15B through 16A and 16B are top views and cross-sectional views illustrating an alternative method for manufacturing a memory device resulting in a fully self-aligned memory cell such as the memory device 100B described in connection with FIG. 1B. The process can include the same stages as illustrated above up to the stage shown in FIGS. 12A and 12B. Then the process diverges from that of FIGS. 13A and 13B as described next.

Figures 15A, 15B:
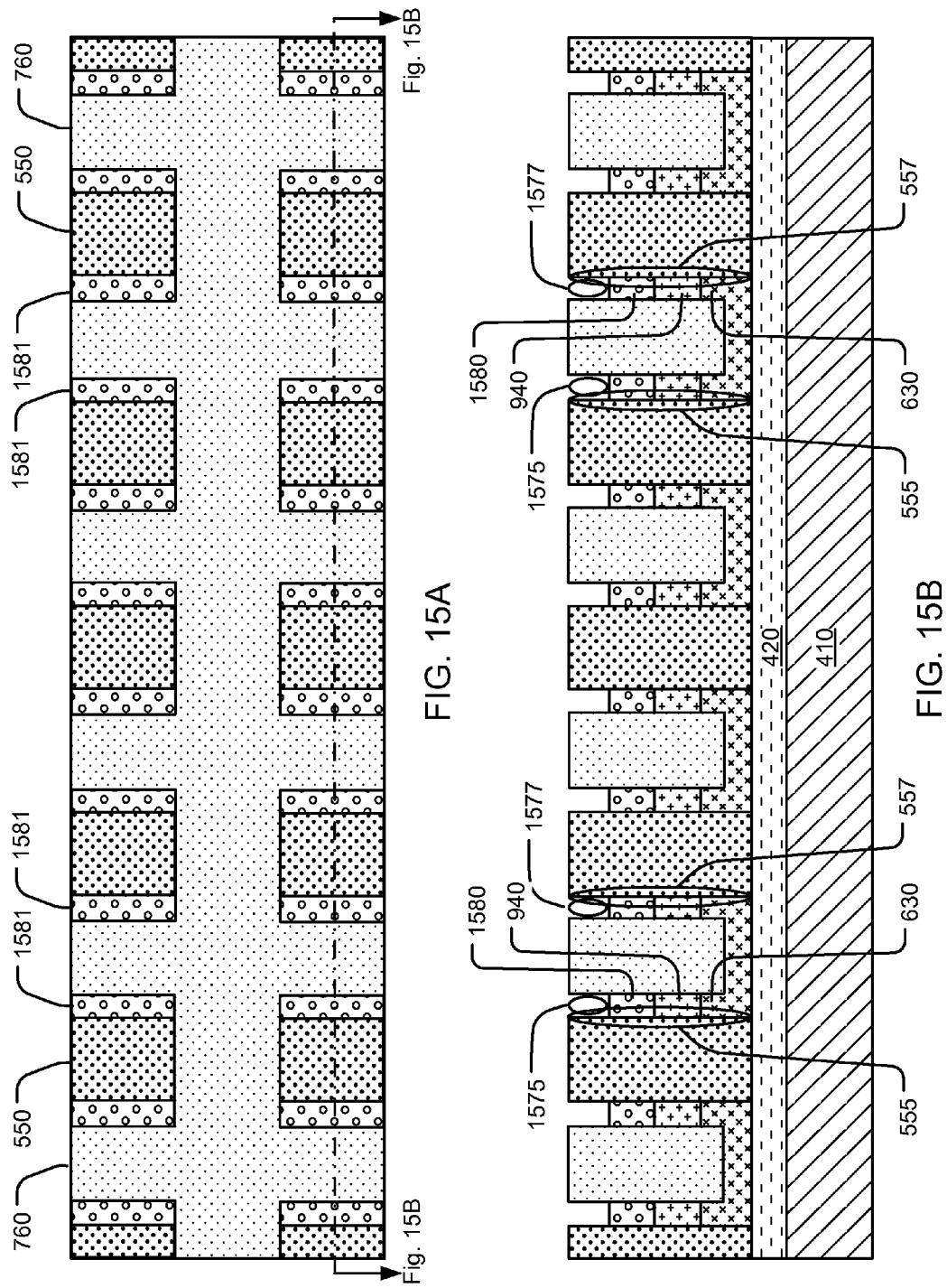

In reference to FIGS. 15A and 15B, the method deposits memory material 1580 in lower portions of the recesses 1275 and 1277 (FIG. 12B) on third portions of the sidewall 555 and the opposing sidewall 557, using a process such as explained above. Upper portions of the recesses 1275 and 1277 form upper recesses 1575 and 1577. FIG. 15A is a top view of the memory device illustrating a top surface 1581 of the memory material 1580 surrounded by the insulating fill material 760 on one side and the patterned insulating layer 550 on another side. The memory material 1580 is in electrical communication with the semiconductor fill 940 and may include a programmable resistance material, such as a phase change material.

Figures 16A, 16B:
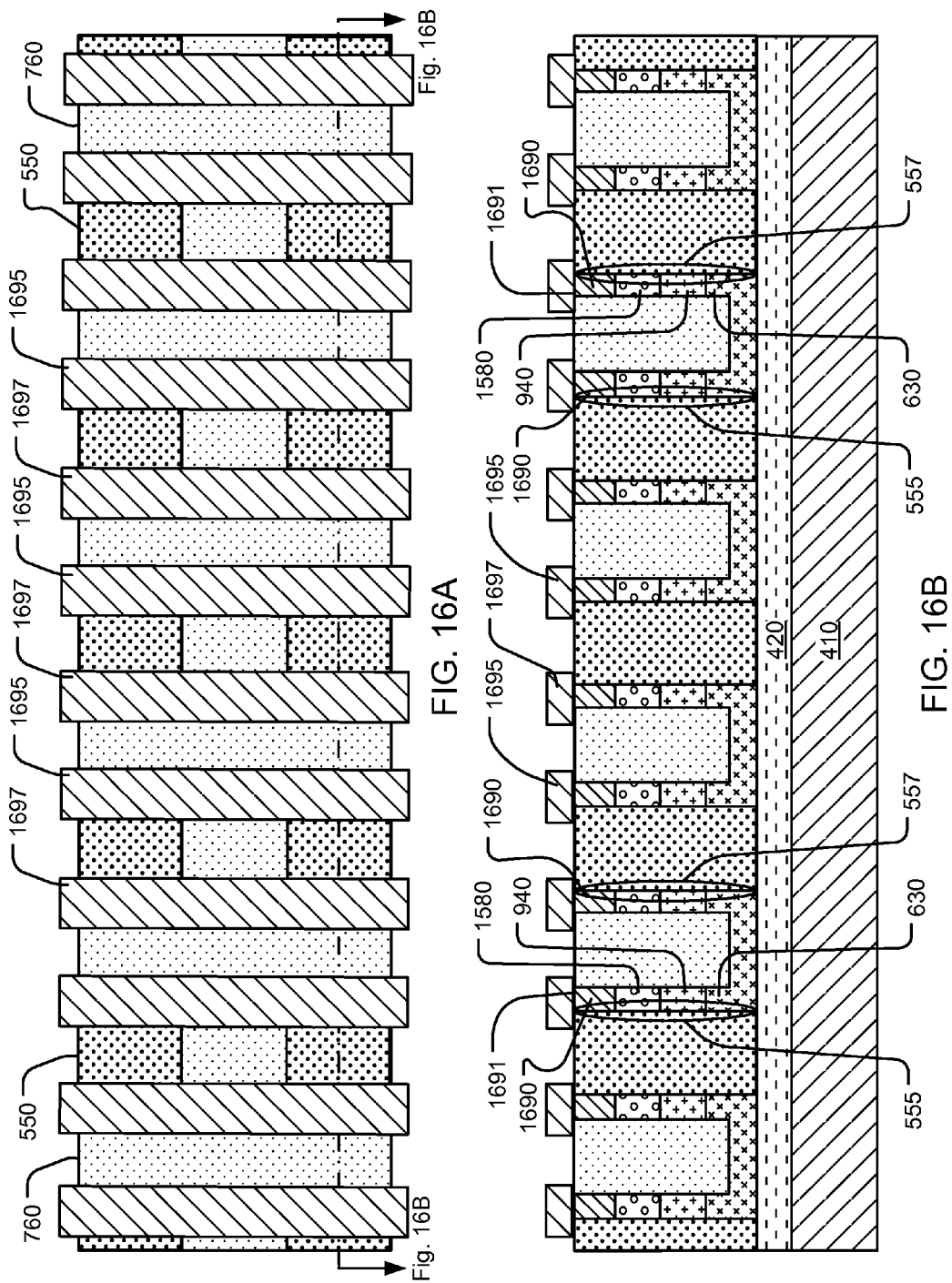

In reference to FIGS. 16A and 16B, the method deposits a conductor material 1690 in the upper recesses 1575 and 1577 (FIG. 15B) on fourth portions of the sidewall 555 and the opposing sidewall 557. The structure is then planarized so that top surfaces 1691 of the conductor material 1690 are exposed and co-planar with the patterned insulating layer 550 and the fill material 760. FIG. 16A is a top view of the memory device illustrating that the first and second top conductors 1695 and 1697 span the strips corresponding to the top surfaces 1691 of the conductor material 1690 surrounded by the insulating fill material 760 and the patterned insulating layer 550. The conductor material 1690 is in electrical communication with the memory material 1580. Thereafter, a patterned conductor layer, including conductors (e.g. 1695, 1697) arranged like the first top conductors 1495 shown in FIGS. 14A and 14B can optionally be formed. Finally, the balance of the integrated circuit manufacturing processes can be completed.

Figure 17:
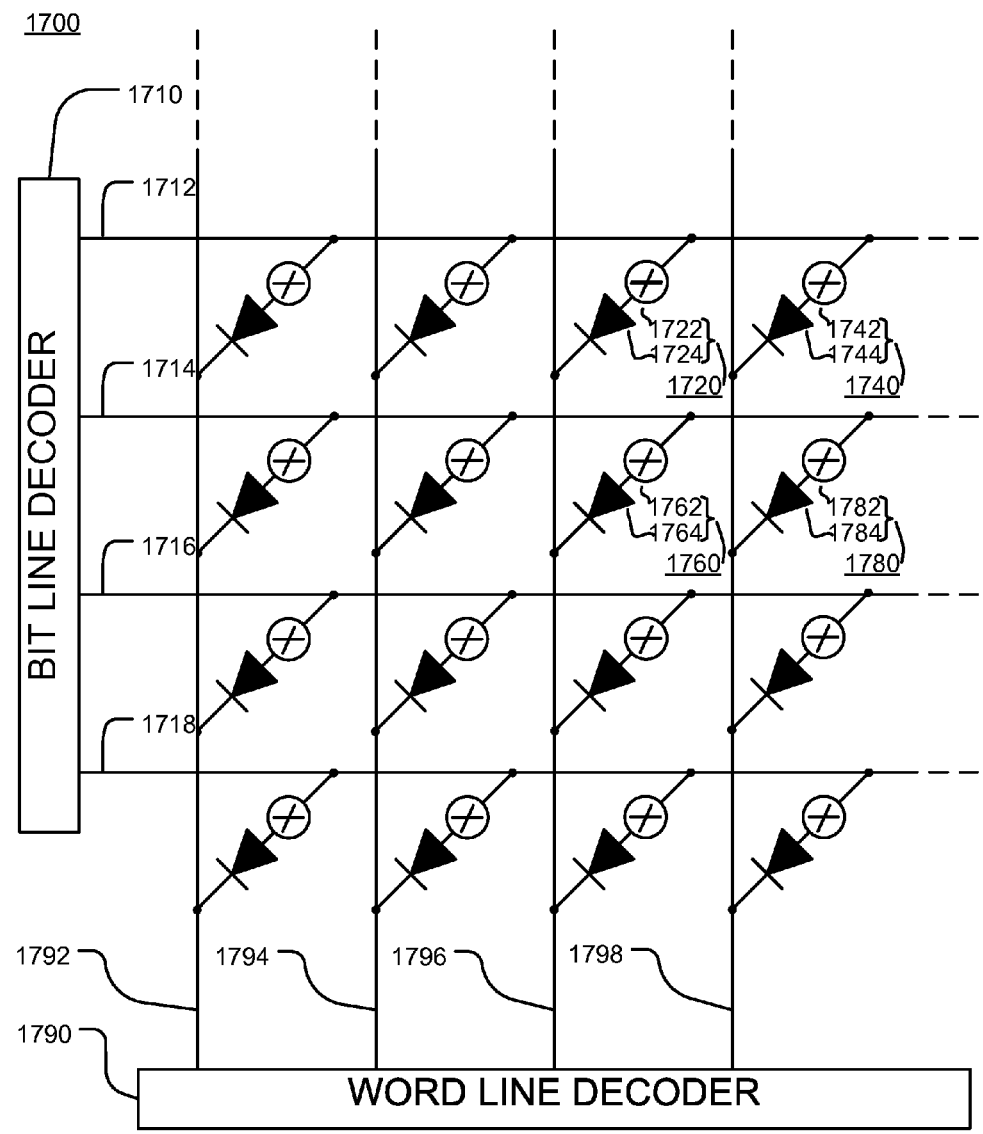
FIG. 17 is a schematic diagram of a portion of an array of memory cells using sidewall diode driving devices.

FIG. 17 is a schematic diagram of a portion of an array of memory cells using sidewall diode driving devices. The memory array 1700 includes a matrix of memory cells, a plurality of word lines and a plurality of bit lines. Each of the memory cells in the example memory array 1700 includes an access diode and a memory element in series between a corresponding word line and a corresponding bit line. The memory cells use a sidewall diode structure in accordance with the present technology such that phase change memory elements are electrically coupled to corresponding access diodes on corresponding first and second sidewalls in trenches defined by a patterned insulating layer on the plurality of word lines. The phase change memory elements may be disposed on the same corresponding first and second sidewalls as the access diodes. Each memory element is electrically coupled to a corresponding access diode. For example, memory cells 1720, 1740, 1760 and 1780 in the matrix of memory cells include phase change memory elements 1722, 1742, 1762 and 1782 electrically coupled to access diodes 1724, 1744, 1764 and 1784, respectively.

The plurality of word lines including word lines 1792, 1794, 1796 and 1798 extends in parallel along a first direction. The word lines 1792, 1794, 1796 and 1798 are in electrical communication with the word line decoder 1790. Cathodes or anodes of diodes may be connected to word lines. For example, the cathodes of diodes 1744 and 1784 are connected to a common word line 1798 while the cathodes of diodes 1724 and 1764 are connected to a common word line 1796. Alternatively, word lines in the plurality of word lines may be electrically coupled to the phase change memory elements.

The plurality of bit lines including bit lines 1712, 1714, 1716 and 1718 extend in parallel along a second direction. The bit lines 1712, 1714, 1716 and 1718 are in electrical communication with the bit line decoder 1710. Phase change memory elements may be connected between anodes or cathodes of diodes and bit lines. For example, the phase change memory element 1742 is connected between the anode of diode 1744 and the bit line 1712 while the phase change memory element 1722 is connected between the anode of diode 1724 and the bit line 1712. The bit line 1712 is common to the phase change memory elements 1722 and 1742 while the bit line 1714 is common to the memory elements 1762 and 1782. It should be noted that the sixteen memory cells in FIG. 17 are shown for convenience of discussion but, in practice, a phase change memory array may comprise thousands to millions of such memory cells.

Figure 18:
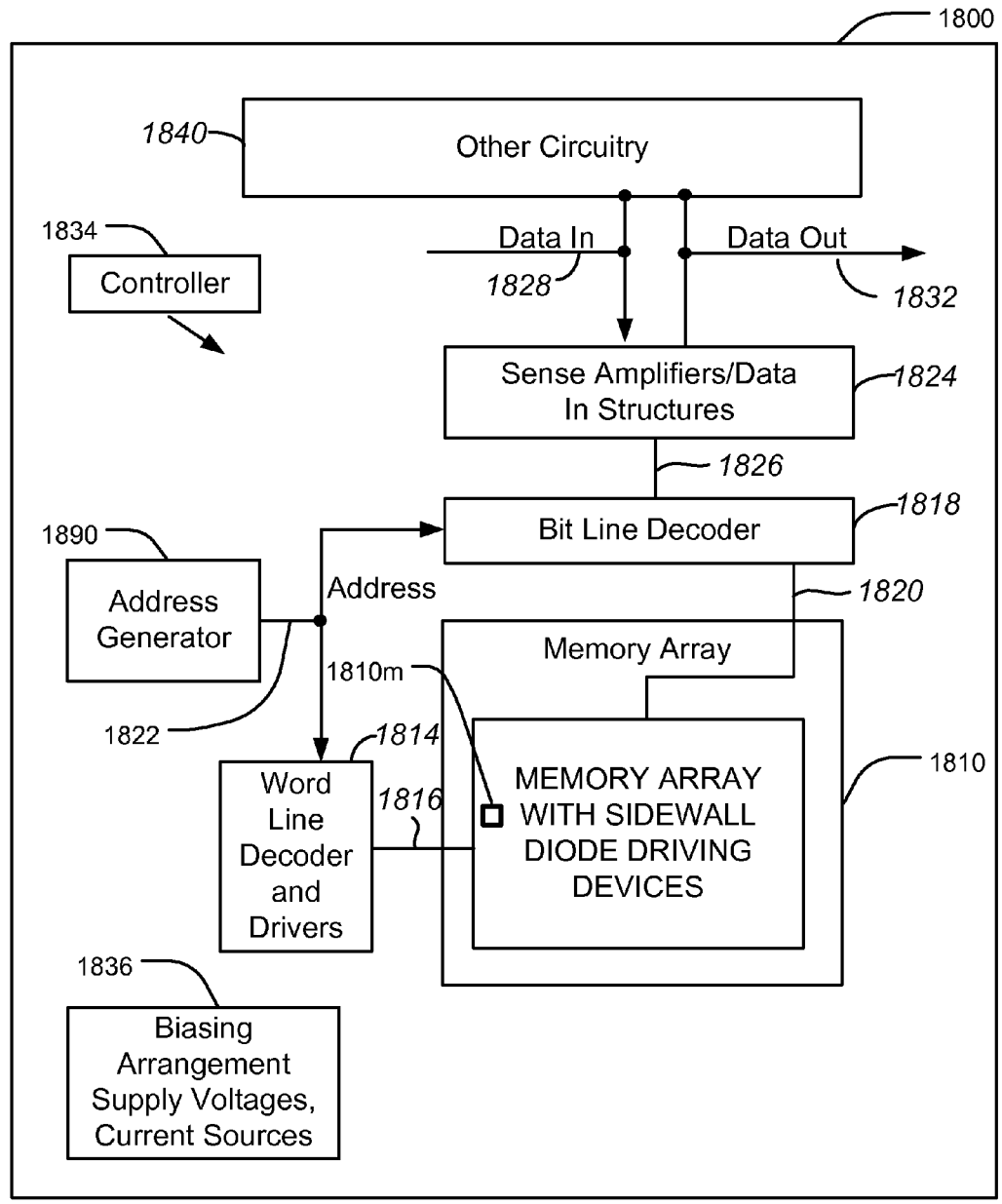
FIG. 18 is a block diagram of an example integrated circuit including an array of memory cells using sidewall diode driving devices.

FIG. 18 is a block diagram of an example integrated circuit including a memory array 1810 which includes a memory array with sidewall diode driving devices 1810*m*. The memory array with sidewall diode driving devices 1810*m* includes memory cells formed of memory elements and sidewall diode driving devices. The memory elements may include programmable resistance memory elements and are coupled to the sidewall diode driving devices. The memory cells are exposed to bias conditions during operation of the memory array 1810. The programmable resistance memory elements can include phase change materials that have an active region which changes phase under bias conditions applied during operation of the memory array 1810. Bus 1822 addresses memory cells in the memory array with sidewall diode driving devices 1810*m*.

During user operation, address generator 1890 first generates, or receives, an address available in the memory array with sidewall diode driving devices 1810*m*. In FIG. 18, a word line decoder and drivers 1814 is coupled to and in electrical communication with a plurality of word lines 1816 in the memory array 1810. A bit line decoder 1818 is in electrical communication with a plurality of bit lines 1820 in the memory array 1810 for reading, setting, and resetting the memory cells in the memory array 1810.

Addresses are supplied on bus 1822 to word line decoder and drivers 1814 and bit line decoder 1818. Sense amplifiers and data-in structures in block 1824, including voltage and/or current sources for the read, set, and reset modes are coupled to bit line decoder 1818 via data bus 1826. Data is supplied via a data-in line 1828 from input/output ports on integrated circuit 1800, or from other data sources internal or external to integrated circuit 1800, to data-in structures in block 1824. Other circuitry 1840 may be included on integrated circuit 1800, such as a general purpose processor or special purpose application circuitry, or a combination of modules providing system-on-a-chip functionality supported by a memory array 1810. Data is supplied via a data-out line 1832 from the sense amplifiers in block 1824 to input/output ports on integrated circuit 1800, or to other data destinations internal or external to integrated circuit 1800.

A controller 1834 implemented, in this example, using a bias arrangement state machine, controls the application of bias arrangement supply voltages and current sources 1836, such as read, set, reset, and program verify voltages and/or currents for the memory array 1810. Controller 1834 may be implemented using special-purpose logic circuitry as known in the art. In alternative embodiments, controller 1834 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1834.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory device, comprising:
a plurality of first access lines, the first access lines including a first semiconductor layer;
a patterned insulating layer on the plurality of first access lines, including a plurality of trenches having first and second sidewalls, extending through the patterned insulating layer to the first semiconductor layer;
first and second sidewall semiconductor layers including P-N junctions on the first and second sidewalls of each trench in the plurality of trenches;
first and second memory elements in electrical communication with the first and second sidewall semiconductor layers in each trench in the plurality of trenches; and
a plurality of second access lines, in electrical communication with the memory elements.

2. The memory device of claim 1, wherein the sidewall semiconductor layers have thicknesses less than 10 nanometers.

3. The memory device of claim 1, wherein the plurality of first access lines comprises one of word lines or bit lines, and the plurality of second access lines comprises another of word lines or bit lines.

4. The memory device of claim 1, wherein the memory elements comprise a programmable resistance material.

5. The memory device of claim 1, wherein the memory elements comprise a phase change material.

6. The memory device of claim 1, wherein the sidewall semiconductor layers include:
intermediate semiconductor layers on first portions of the first and second sidewalls in the plurality of trenches, and in contact with the first semiconductor layer, the intermediate semiconductor layers having lower carrier concentrations than corresponding first semiconductor layers;
and second semiconductor layers on second portions of the first and second sidewalls in the plurality of trenches, and in contact with the intermediate semiconductor layers, the second semiconductor layers having higher carrier concentrations than corresponding intermediate semiconductor layers.

7. The memory device of claim 6, wherein the intermediate semiconductor layers include an intrinsic semiconductor.

8. The memory device of claim 6, including layers of electrode material on corresponding third portions of the first and second sidewalls over the second semiconductor layers, and the memory elements are disposed over the patterned insulating layer in contact with the layers of electrode material.

9. The memory device of claim 6, wherein the memory elements comprise layers of memory material on corresponding third portions of the first and second sidewalls in the plurality of trenches, and further including layers of electrode material on corresponding fourth portions of the first and second sidewalls, over the layers of memory material.

10. A memory device, comprising:
a first conductor, a diode, a memory element and a second conductor arranged in series, the diode including a P-N junction in a sidewall semiconductor layer, wherein the sidewall semiconductor layer has a thickness less than 10 nanometers.

11. A memory device, comprising:
a plurality of first access lines, the first access lines including a first semiconductor layer;
a patterned insulating layer on the plurality of first access lines, including a plurality of trenches having first and second sidewalls, extending through the patterned insulating layer to the first semiconductor layer;
sidewall semiconductor layers including P-N junctions on the first and second sidewalls of the plurality of trenches;
memory elements in electrical communication with the sidewall semiconductor layers; and
a plurality of second access lines, in electrical communication with the memory elements,
wherein the sidewall semiconductor layers have thicknesses less than 10 nanometers.

12. A memory device, comprising:
a first conductor, a diode, a memory element and a second conductor arranged in series, the diode including a P-N junction in a sidewall semiconductor layer on a sidewall of an opening in an insulating layer overlying the first conductor; and a second diode, a second memory element and a third conductor arranged in series with the first conductor, the second diode that is mirror image symmetrical with said first mentioned diode, and includes a P-N junction in another sidewall semiconductor layer on an opposing sidewall of the opening.

13. The memory device of claim 12, wherein the sidewall semiconductor layers of the first and second diodes are layers of semiconductor material on the sidewall and the opposing sidewall of the opening.

14. The memory device of claim 13, including a layer of electrode material disposed over the layer of semiconductor material on the opposing sidewalls, and the memory elements are disposed over the insulating layer in contact with the layer of electrode material.

15. The memory device of claim 13, wherein the memory elements include a layer of memory material disposed over the layer of semiconductor material on the opposing sidewalls, and further including a layer of electrode material disposed over the layer of memory material in contact with the layer of memory material.

16. The memory device of claim 15, wherein said second conductor comprises the layer of electrode material.

17. The memory device of claim 12, including an intrinsic semiconductor at the P-N junction.

18. The memory device of claim 12, wherein the sidewall semiconductor layer has a thickness less than 10 nanometers.

19. The memory device of claim 12, wherein the first conductor comprises one of a word line or bit line, and the second conductor comprises another of a word line or a bit line.

20. The memory device of claim 12, wherein the memory element comprises a programmable resistance material.

21. The memory device of claim 12, wherein the memory element comprises a phase change material.

22. A memory device, comprising:

a first conductor, a diode, a memory element and a second conductor arranged in series, the diode including a P-N junction in a sidewall semiconductor layer on a sidewall of an opening in an insulating layer overlying the first conductor, wherein the sidewall semiconductor layer has a thickness less than 10 nanometers.

* * * * *